US012733354B2

(12) United States Patent
Jang et al.

(10) Patent No.: US 12,733,354 B2
(45) Date of Patent: Sep. 8, 2026

(54) DISPLAY DEVICE

(71) Applicant: Samsung Display Co., LTD., Yongin-si (KR)

(72) Inventors: Kwon Jang, Yongin-si (KR); Jun-Young Jung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 388 days.

(21) Appl. No.: 18/491,055

(22) Filed: Oct. 20, 2023

(65) Prior Publication Data

US 2024/0188347 A1 Jun. 6, 2024

(30) Foreign Application Priority Data

Dec. 5, 2022 (KR) ........................ 10-2022-0168049

(51) Int. Cl.

*H10K 59/124* (2023.01)
*H10K 59/121* (2023.01)
*H10K 59/80* (2023.01)
*H10K 59/88* (2023.01)

(52) U.S. Cl.

CPC ......... *H10K 59/124* (2023.02); *H10K 59/873* (2023.02)

(58) Field of Classification Search

CPC ............... H10K 59/124; H10K 59/873; H10K 59/8722; H10K 59/1213

See application file for complete search history.

(56) References Cited

U.S. PATENT DOCUMENTS

2020/0106046 A1* 4/2020 Kim ..................... H10K 59/121
2020/0152842 A1* 5/2020 Park ...................... G06F 1/1686
2020/0235180 A1 7/2020 Park et al.
2021/0257592 A1 8/2021 Lee et al.
2021/0305521 A1* 9/2021 Han ................... C08G 73/1071
2023/0284486 A1* 9/2023 Park ..................... H10K 59/123

FOREIGN PATENT DOCUMENTS

KR 10-1268237 5/2013
KR 10-2020-0041420 4/2020
KR 10-2020-0090595 A 7/2020
KR 10-2020-0145952 12/2020
KR 10-2021-0105451 A 8/2021
KR 10-2022-0087664 6/2022

* cited by examiner

*Primary Examiner* — Mohsen Ahmadi
(74) *Attorney, Agent, or Firm* — Innovation Counsel LLP

(57) ABSTRACT

A display device includes a display area and a non-display area disposed adjacent to the display area, a light emitting element disposed in the display area on a substrate, a plurality of grooves disposed in the non-display area on the substrate and including a first groove and a second groove, a plurality of first pattern layers disposed adjacent to the first groove and including an opaque material, an end of each of the plurality of first pattern layers being a first tip protruding toward the first groove, and at least one second pattern layer disposed adjacent to the second groove and including a transparent material, an end of the at least one second pattern layer being a second tip protruding toward the second groove.

14 Claims, 27 Drawing Sheets

DD
DA
FL
ENC
EN3
EN2
EN1
EL
CME
EML
PE
PDL
IL7
CE
IL6
DE2
SE2
IL5
IL4
IL3
IL2
IL1
BUF
SUB
I
I'
TR2 ACT2 GE3
TR1 SE1 ACT1 GE1 GE2 DE1

DD
FL
EN3
EN2
EN1
CME
EML
IL7
PL1
PT1
IL6
IL5
IL4
IL3
IL2
IL1
BUF
SUB
DR2
DR1
II
II'
MA
OA
OC
TH
FM
DAM1
DAM2
SUL3
SUL2
SUL1
SUL3'
SUL2'
SUL1'
PL2
PT2
G1
G2
G3
G4
DS
LL
A
CL1
CL2
CL3
ENC
G

DAM1
SUL3 SUL2 SUL1
DAM2
SUL3' SUL2' SUL1'
PL2
G1
G2
G3
G4
DS
CL1 CL2 CL3 LL DS
DS {CL1 CL2 CL3
G {G1 G2 G3 G4
IL7
PL1
IL6
IL5
IL4
IL3
IL2
IL1
BUF
SUB
DR2
DR1

DAM1
SUL3 SUL2 SUL1
DAM2
PL2 SUL3' SUL2' SUL1'
G1
G2
G3
G4
CME
EML
IL7
PL1
IL6
IL5
IL4
IL3
IL2
IL1
BUF
SUB
CL1 CL2 CL3 LL
DS{CL1 CL2 CL3
G{G1 G2 G3 G4
DR2
DR1

DD
FL
EN3
EN2
EN1
CME
EML
IL7
PL1
IL6
IL5
IL4
IL3
IL2
IL1
BUF
SUB
DR2
DR1
MA
OA
OC
DAM1
SUL3 SUL2 SUL1
DAM2
SUL3' SUL2' SUL1'
PL2
G1
G2
G3
G4
CL1 CL2 CL3 LL
DS{CL1 CL2 CL3
ENC{EN1 EN2 EN3
G{G1 G2 G3 G4

DISPLAY DEVICE

CROSS REFERENCE TO RELATED APPLICATION(S)

This application claims priority to and benefits of Korean Patent Application No. 10-2022-0168049 under 35 U.S.C. § 119, filed on Dec. 5, 2022, in the Korean Intellectual Property Office (KIPO), the entire contents of which are incorporated herein by reference.

BACKGROUND

1. Technical Field

Embodiments provide a display device including a functional area in which a functional module is disposed.

2. Description of the Related Art

With the development of information technology, the importance of a display device, which is a connection medium between a user and information, has been highlighted. For example, a use of a display device such as a liquid crystal display device ("LCD"), an organic light emitting display device ("OLED"), a plasma display device ("PDP"), a quantum dot display device, and the like is increasing.

The display device may include a display area where an image is displayed and a non-display area positioned adjacent to the display area. Multiple pixels for displaying an image and lines connected to the pixels may be disposed in the display area. Drivers for driving the pixels and functional modules such as a camera module, a sensor module, and the like may be disposed in the non-display area.

A through hole may be formed in the display area to reduce dead space in the non-display area. The functional module may be disposed inside the through hole, and the functional module may sense or recognize an object, a user, or the like positioned in front of the display device through the through hole.

SUMMARY

Embodiments provide a display device with improved reliability.

A display device according to embodiments of the disclosure may include a display area and a non-display area disposed adjacent to the display area, a light emitting element disposed in the display area on a substrate, a plurality of grooves disposed in the non-display area on the substrate and including a first groove and a second groove, a plurality of first pattern layers disposed adjacent to the first groove and including an opaque material, an end of each of the plurality of first pattern layers being a first tip protruding toward the first groove, and at least one second pattern layer disposed adjacent to the second groove and including a transparent material, an end of the at least one second pattern layer being a second tip protruding toward the second groove.

In an embodiment, the non-display area may include a functional area surrounded by the display area and in which a functional module is disposed. The plurality of grooves, the plurality of first pattern layers, and the at least one second pattern layer may be disposed in the functional area.

In an embodiment, the functional area may include an opening area in which the functional module is disposed and a middle area surrounding the opening area. The display device may further include at least one dam disposed between the plurality of grooves in the middle area.

In an embodiment, the at least one dam may include a first dam and a second dam arranged in a direction from the display area toward the opening area.

In an embodiment, each of the first dam and the second dam may include a first sub-layer, a second sub-layer disposed on the first sub-layer, and a third sub-layer disposed on the second sub-layer. Each of the first, second, and third sub-layers may include an organic material. The at least one second pattern layer may be disposed on a portion of the first sub-layer of the second dam and extend along a side surface of the second sub-layer of the second dam to a portion of an upper surface of the second sub-layer of the second dam.

In an embodiment, the light emitting element may include a pixel electrode, an organic light emitting layer disposed on the pixel electrode, and a common electrode disposed on the organic light emitting layer. The organic light emitting layer and the common electrode may be disconnected at the first and second tips in the functional area.

In an embodiment, the functional module may include at least one of a camera module, a face recognition sensor module, a pupil recognition sensor module, an acceleration sensor module, a proximity sensor module, an infrared sensor module, and an illuminance sensor module.

In an embodiment, the opaque material may include a metal.

In an embodiment, the transparent material may include at least one of a conductive metal oxide and a silicon compound.

In an embodiment, the conductive metal oxide may include at least one of indium gallium oxide (IGO), indium zinc oxide (IZO), indium tin oxide (ITO), indium zinc tin oxide (IZTO), and indium gallium zinc oxide (IGZO).

In an embodiment, the silicon compound may include at least one of silicon oxide, silicon nitride, and silicon oxynitride.

In an embodiment, the display device may further include an active pattern disposed in the display area on the substrate, a gate electrode disposed on the active pattern, a source electrode and a drain electrode disposed on the gate electrode, and a connection electrode disposed on the drain electrode and electrically connected to the drain electrode.

In an embodiment, the plurality of first pattern layers and the connection electrode may include a same material.

In an embodiment, each of the plurality of first pattern layers may be disposed adjacent to at least a side of the first groove and the at least one second pattern layer may be disposed adjacent to at least a side of the second groove. The first tip may be disposed on the first groove and the second tip may be disposed on the second groove.

In an embodiment, the display device may further include an encapsulation layer including at least one inorganic encapsulation layer and an organic encapsulation layer disposed on the light emitting element.

In an embodiment, the organic encapsulation layer may extend from the display area to a portion of the non-display area and at least one of the plurality of grooves may be filled with the organic encapsulation layer.

A display device according to embodiments of the disclosure may include a display area, a functional area surrounded by the display area, and a non-display area disposed adjacent to the display area, a light emitting element disposed in the display area on a substrate, a plurality of first grooves disposed in the functional area on the substrate, at least one second groove disposed in the non-display area on the substrate, a plurality of first pattern layers disposed adjacent to the plurality of first grooves and including an opaque material, an end of each of the plurality of first pattern layers being a first tip protruding toward each of the plurality of first grooves, and at least one second pattern layer disposed adjacent to the at least one second groove and including a transparent material, an end of the at least one second pattern layer being a second tip protruding toward the at least one second groove.

In an embodiment, the non-display area may include a pad area in which a plurality of signal pads are disposed and including a test area adjacent to the plurality of signal pads. The at least one second groove and the at least one second pattern layer may be disposed in the test area.

In an embodiment, the opaque material may include a metal material, and the transparent material may include at least one of a conductive metal oxide and a silicon compound.

In an embodiment, the display device may further include an active pattern disposed in the display area on the substrate, a gate electrode disposed on the active pattern, a source electrode and a drain electrode disposed on the gate electrode, and a connection electrode disposed on the drain electrode and electrically connected to the drain electrode. The plurality of first pattern layers and the connection electrode may include a same material.

A display device according to an embodiment of the disclosure may include a plurality of first pattern layers disposed in a functional area and including an opaque material, an end of each of the plurality of first pattern layers being a first tip protruding toward a first groove, and at least one second pattern layer disposed in a non-display area (e.g., a functional area, a test area, and the like) and including a transparent material, an end of the at least one second pattern layer being a second tip protruding toward a second groove. Accordingly, the critical dimension of the first tip of the first pattern layer may be predicted by measuring the critical dimension of the second tip of the second pattern layer. Through this, to monitor whether an organic light emitting layer and a common electrode are disconnected in the functional area may be possible.

BRIEF DESCRIPTION OF THE DRAWINGS

Illustrative, non-limiting embodiments will be more clearly understood from the following detailed description in conjunction with the accompanying drawings.

DETAILED DESCRIPTION OF THE EMBODIMENTS

Figure 1:
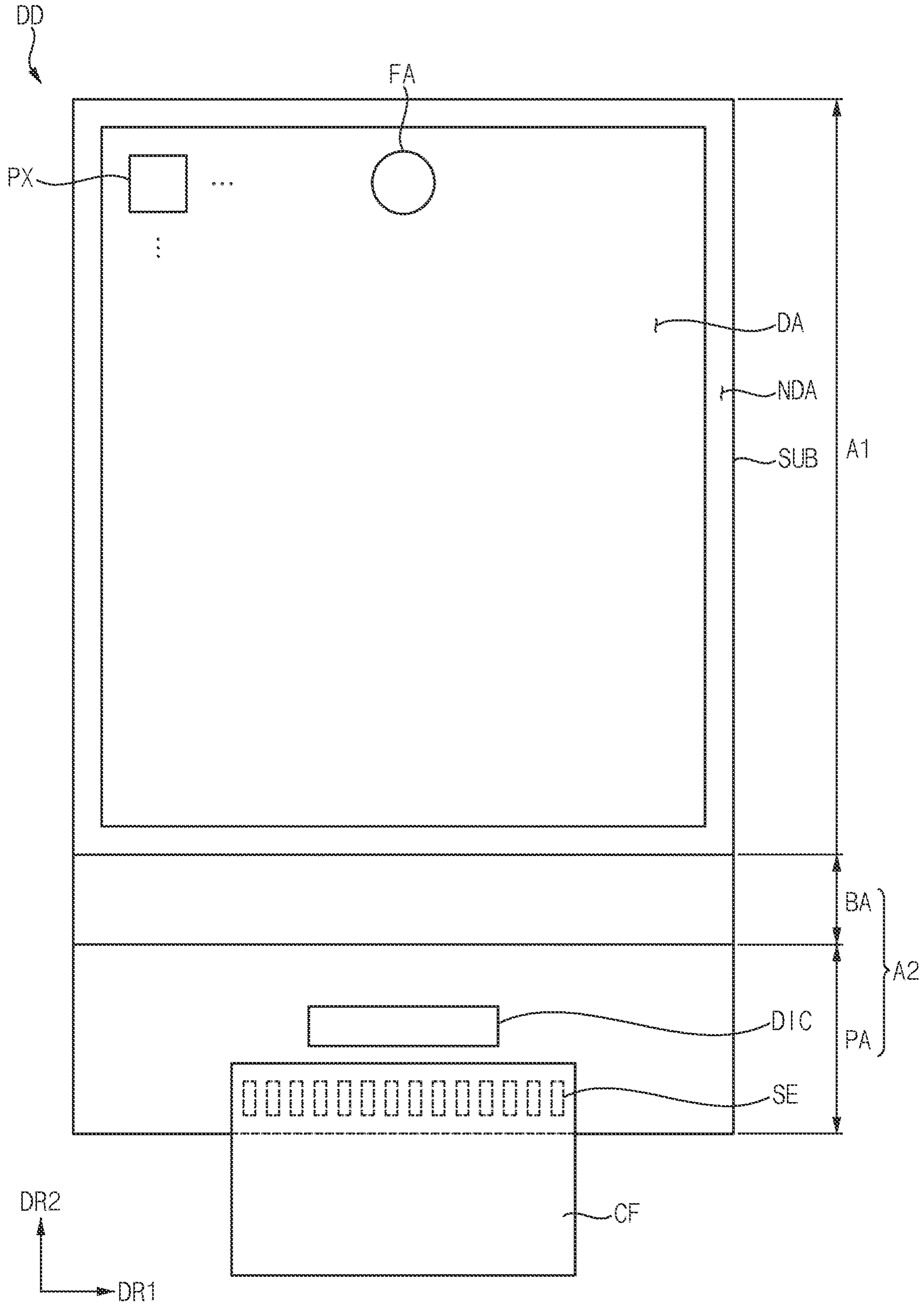
FIG. 1 is a schematic plan view illustrating a display device according to an embodiment of the disclosure.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "under," "lower," "upper," "over," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the example term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including,"

when used in this specification, specify the presence of stated features, integers, steps, operations, elements, components, and/or groups thereof, but do not preclude the presence or addition of one or more other features, integers, steps, operations, elements, components, and/or groups thereof.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some example embodiments may be physically separated into two or more interacting and discrete blocks, units, and/or modules without departing from the scope of the disclosure. Further, the blocks, units, and/or modules of some example embodiments may be physically combined into more complex blocks, units, and/or modules without departing from the scope of the disclosure.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the first direction DR1, the second direction DR2, and the third direction DR3 are not limited to three axes of a rectangular coordinate system, such as the x, y, and z axes, and may be interpreted in a broader sense. For example, the first direction DR1, the second direction DR2, and the third direction DR3 may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ.

Unless otherwise specified, the illustrated embodiments are to be understood as providing example features of the disclosure. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, a display device according to embodiments of the disclosure will be explained in detail with reference to the accompanying drawings. The same reference numerals are used for the same components in the drawings, and redundant descriptions of the same components will be omitted.

Figure 2:
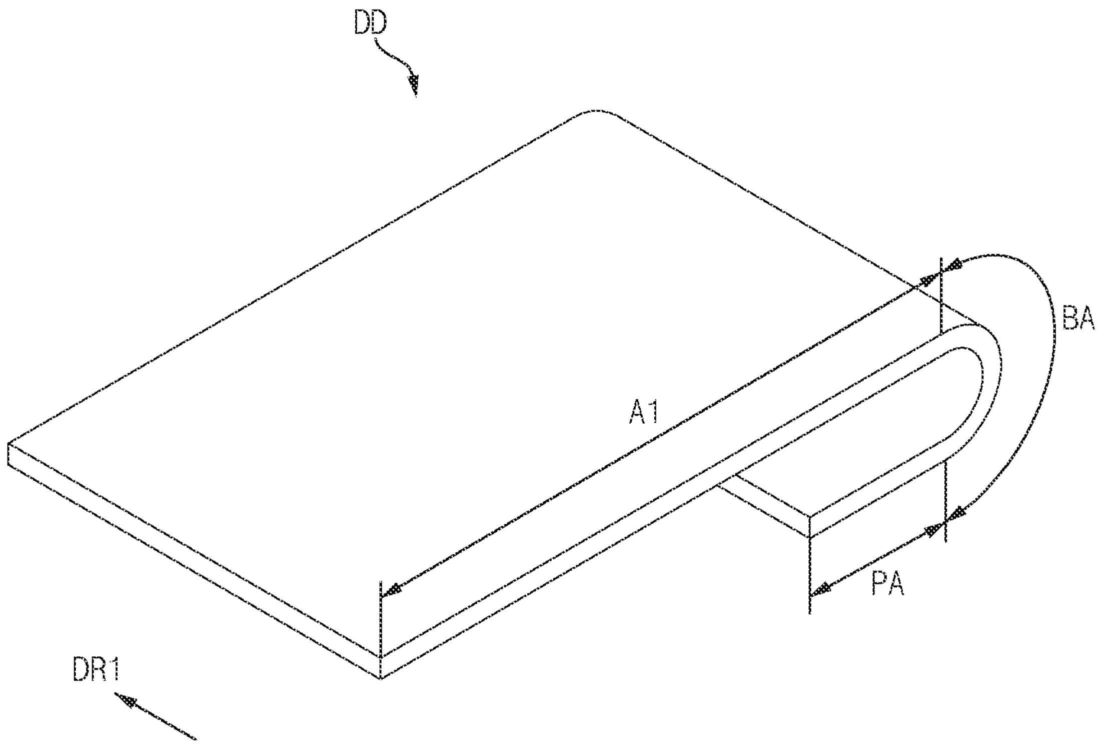
FIG. 2 is a schematic perspective view illustrating a bent shape of the display device of FIG. 1.
Figure 3:
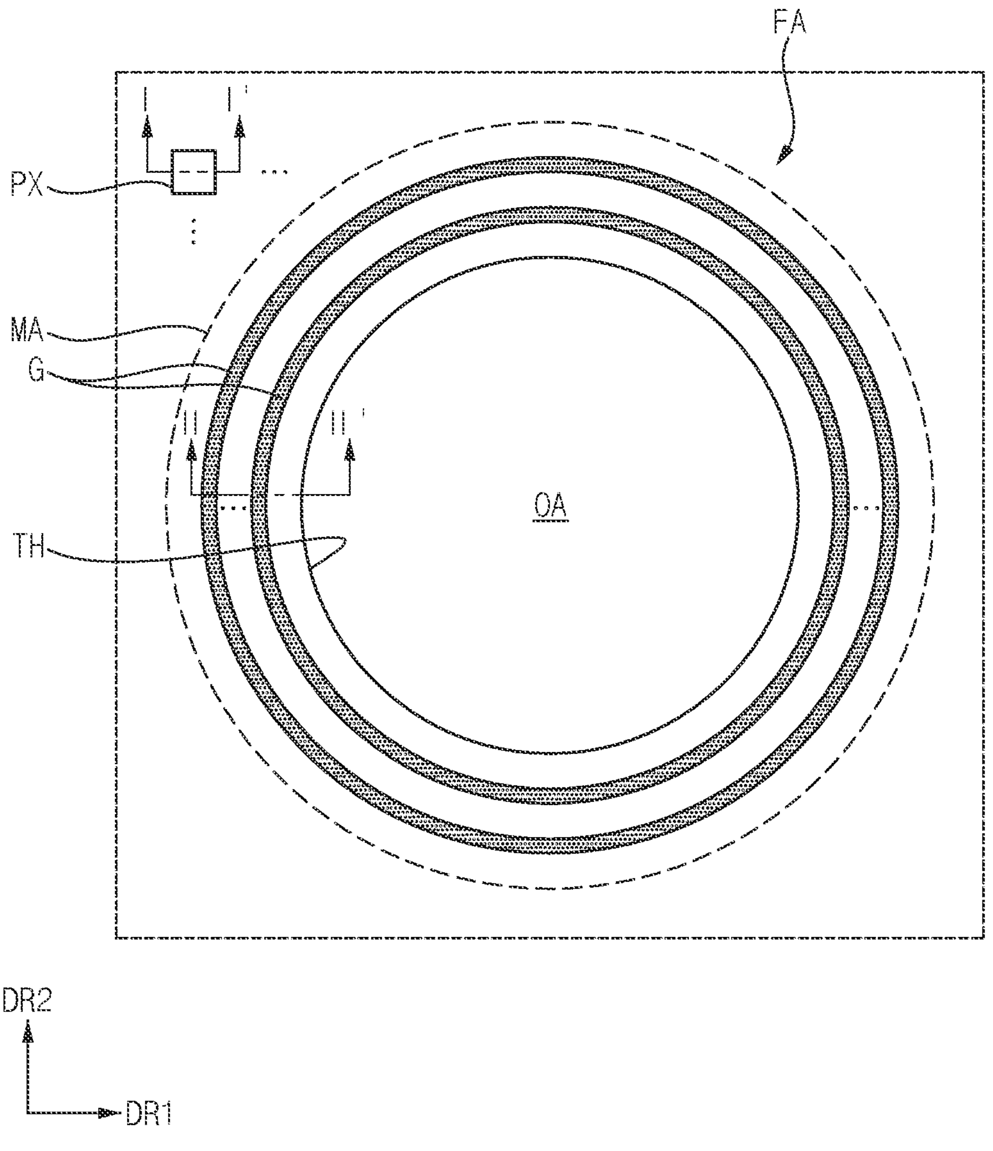
FIG. 3 is a schematic enlarged plan view of a functional area of FIG. 1.

FIG. 1 is a schematic plan view illustrating a display device according to an embodiment of the disclosure. FIG. 2 is a schematic perspective view illustrating a bent shape of the display device of FIG. 1. FIG. 3 is a schematic enlarged plan view of a functional area of FIG. 1.

Referring to FIGS. 1, 2, and 3, a display device DD according to an embodiment may include a substrate SUB, a driving integrated circuit DIC, signal pads SE, and a connection film CF.

The display device DD may have a rectangular shape in a plan view. However, the disclosure is not limited thereto, and the display device DD may have other shapes in a plan view.

The substrate SUB may include a first area A1 and a second area A2. The first area A1 may include a display area DA, a functional area FA, and a portion of a non-display area NDA, and the second area A2 may include another portion of the non-display area NDA.

The display area DA may be an area displaying an image by generating light or adjusting transmittance of light provided from an external light source. The non-display area NDA may be an area not displaying an image. The non-display area NDA may be disposed adjacent to the display area DA. For example, the non-display area NDA may surround (e.g., entirely surround) the display area DA.

Multiple pixels PX may be disposed in the display area DA. Each of the pixels PX may emit light. As each of the pixels PX emits light, the display area DA may display an image. For example, the pixels PX may be arranged in a matrix form in a first direction DR1 and a second direction DR2 intersecting the first direction DR1.

Lines connected to the pixels PX may be disposed in the display area DA. For example, the lines may include a data signal line, a gate signal line, a power line, and the like.

A driver for driving the pixels PX may be disposed in the non-display area NDA. For example, the driver may include a gate driver, a light emitting driver, a power voltage generator, a timing controller, and the like. The pixels PX may emit light based on signals transmitted from the driver.

The functional area FA may be a non-display area positioned within the display area DA. For example, at least a portion of the functional area FA may be surrounded by an adjacent display area DA.

For example, as illustrated in FIG. 1, the functional area FA may be positioned at an upper center of the display area DA. In another embodiment, the functional area FA may be positioned in an upper left corner or an upper right corner of the display area DA. As illustrated in FIG. 1, the number of the functional area FA may be one. In another embodiment, multiple functional areas FA may be provided.

A functional module (see, e.g., a functional module FM of FIG. 5) may be disposed in the functional area FA. For example, the functional module may include a camera module for capturing (or recognizing) an image of an object positioned in front of the display device DD, a face recognition sensor module for detecting user's face, a pupil recognition sensor module for detecting user's pupil, an acceleration sensor module and geomagnetic sensor module for determining a movement of the display device DD, a proximity sensor module and infrared sensor module for detecting proximity of the front of the display device DD, a illuminance sensor for measuring a degree of an external brightness, or the like.

The functional area FA may include an opening area OA and a middle area MA positioned around the opening area OA. The middle area MA may have a shape surrounding the opening area OA in a plan view and may be surrounded by the display area DA.

In an embodiment, multiple grooves G may be disposed in the middle area MA. For example, each of the grooves G may have a shape surrounding the opening area OA in a plan view. The grooves G may be spaced apart from each other in a plan view.

In an embodiment, a through hole TH penetrating the display device DD may be formed in the opening area OA. At least a portion of the functional module may be disposed inside the through hole TH. For example, the functional module may include at least a camera module or the like.

Another portion of the non-display area NDA of the second area A2 may include a bending area BA and a pad area PA. The pad area PA may be spaced apart from a side of the display area DA in a direction opposite to the second direction DR2 and may be disposed parallel to an upper surface of the substrate SUB.

The bending area BA may be positioned between the display area DA and the pad area PA in a plan view. As illustrated in FIG. 2, the bending area BA may be bent about a bending axis extending in the first direction DR1. The first area A1 and the pad area PA may overlap in a plan view (or in a thickness direction of the display device DD). The display device DD may be provided in a shape in which the bending area BA is bent about the bending axis.

The driving integrated circuit DIC may be disposed in the pad area PA on the substrate SUB. The driving integrated circuit DIC may convert a digital data signal among driving signals into an analog data signal and provide the converted analog data signal to the pixels PX. For example, the driving integrated circuit DIC may be a data driver.

The signal pads SE may be disposed in the pad area PA on the substrate SUB. The signal pads SE may be spaced apart from each other in the first direction DR1. Some of the signal pads SE may be connected to the driving integrated circuit DIC through a line, and a remaining one of the signal pads SE may be connected to the pixels PX through a line. For example, each of the signal pads SE may include a metal, an alloy, a metal nitride, a conductive metal oxide, a transparent conductive material, or the like. The metal, the alloy, the metal nitride, the conductive metal oxide, the transparent conductive material, or the like may be used alone or in combination with each other.

The connection film CF may be disposed in the pad area PA on the substrate SUB. The connection film CF may overlap a portion of the pad area PA in a plan view. An end of the connection film CF may be electrically connected to the signal pads SE, and another end of the connection film CF may be electrically connected to an external device. For example, the driving signal, driving voltage, and the like generated from the external device may be provided to the driving integrated circuit DIC and the pixels PX through the connection film CF and the signal pads SE. For example, the connection film CF may be a flexible printed circuit board (FPCB), a printed circuit board (PCB), a flexible flat cable (FFC), or the like.

Referring to FIG. 1, the driver integrated circuit DIC may be disposed in a chip on plastic (COP) method or a chip on glass (COG) method, but the disclosure is not limited thereto. For example, the driving integrated circuit DIC may be disposed in a chip on film (COF) method.

In this specification, a plane may be defined by the first direction DR1 and the second direction DR2 intersecting the first direction DR1. For example, the first direction DR1 may be perpendicular to the second direction DR2.

Figure 4:
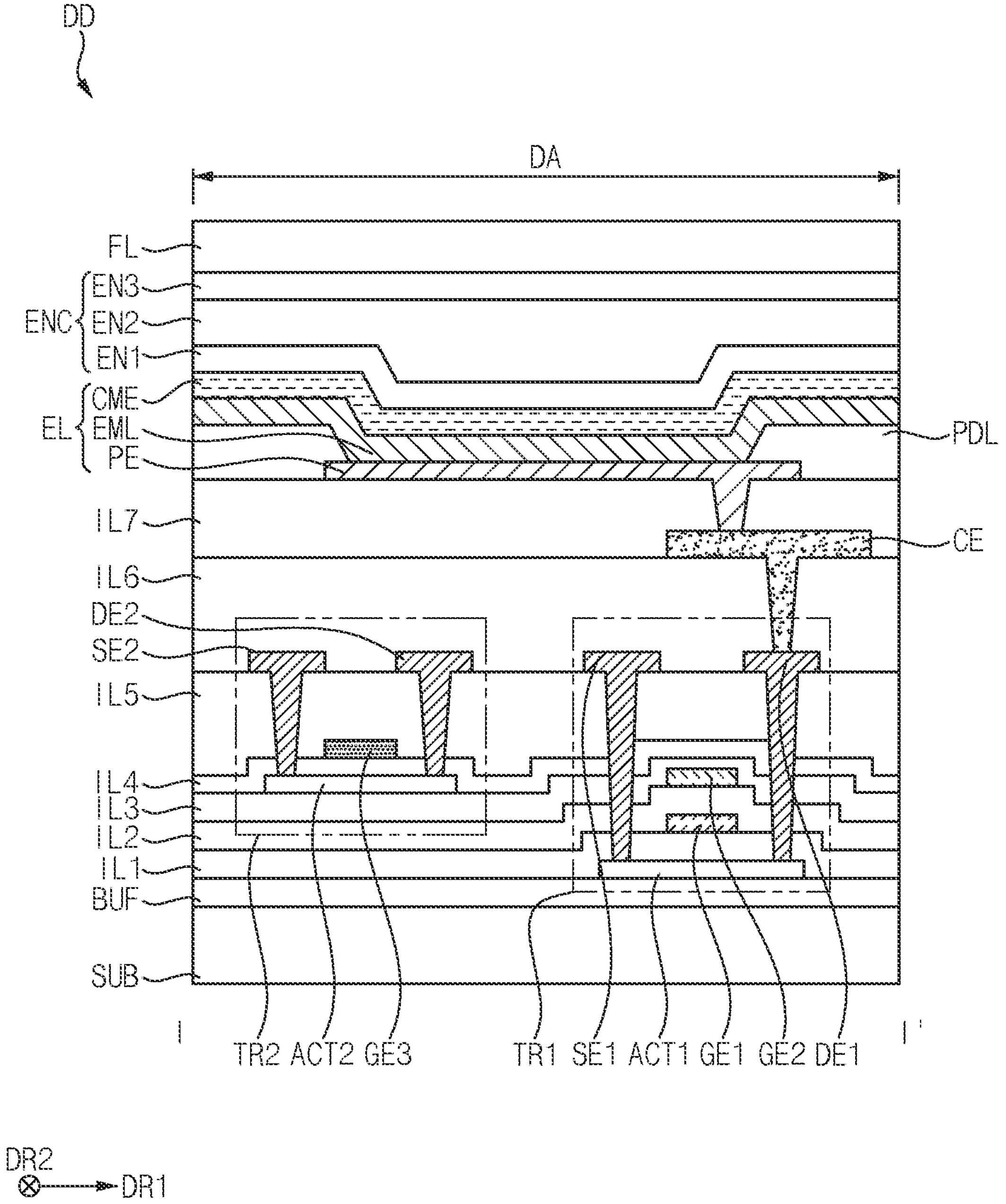
FIG. 4 is a schematic cross-sectional view taken along line I-I' of FIG. 3.

FIG. 4 is a schematic cross-sectional view taken along line I-I' of FIG. 3. For example, FIG. 4 is a schematic cross-sectional view illustrating a portion of the display area DA of FIG. 3.

Referring to FIG. 4, the display device DD according to an embodiment of the disclosure may include the substrate SUB, a buffer layer BUF, a first transistor TR1, a second transistor TR2, a first, a second, a third, a fourth, a fifth, a sixth, and a seventh insulating layers IL1, IL2, IL3, IL4, IL5, IL6, and IL7, a connection electrode CE, a pixel defining layer PDL, a light emitting element EL, an encapsulation layer ENC, and a functional layer FL.

The first transistor TR1 may include a first active pattern ACT1, a first gate electrode GE1, a second gate electrode GE2, a first source electrode SE1, and a first drain electrode DE1. The second transistor TR2 may include a second active pattern ACT2, a third gate electrode GE3, a second source electrode SE2, and a second drain electrode DE2. The light emitting element EL may include a pixel electrode PE, an organic light emitting layer EML, and a common electrode CME. The encapsulation layer ENC may include a first inorganic encapsulation layer EN1, an organic encapsulation layer EN2, and a second inorganic encapsulation layer EN3.

The substrate SUB may include a transparent material or an opaque material. The substrate SUB may be a transparent resin substrate. Examples of the transparent resin substrate may include a polyimide substrate and the like. The polyimide substrate may include a first organic layer, a first barrier layer, a second organic layer, or the like. In another embodiment, the substrate SUB may be a quartz substrate, a synthetic quartz substrate, a calcium fluoride substrate, an F-doped quartz substrate, a soda-lime glass substrate, a non-alkali glass substrate, or the like. The transparent material or the opaque material may be used alone or in combination with each other.

The buffer layer BUF may be disposed on the substrate SUB. The buffer layer BUF may prevent diffusion of metal atoms or impurities from the substrate SUB into the first and second transistors TR1 and TR2. The buffer layer BUF may improve flatness of a surface of the substrate SUB in case that the surface of the substrate SUB is not uniform. For example, the buffer layer BUF may include an inorganic material such as silicon oxide ($SiO_x$), silicon nitride ($SiN_x$), silicon oxynitride ($SiO_xN_y$), and the like. The inorganic material may be used alone or in combination with each other.

The first active pattern ACT1 may be disposed in the display area DA on the buffer layer BUF. In an embodiment, the first active pattern ACT1 may include an inorganic semiconductor such as amorphous silicon, polycrystalline silicon, and the like. For example, the first active pattern ACT1 may have a first source region, a first drain region, and a first channel region positioned between the first source region and the first drain region.

The first insulating layer IL1 may be disposed on the buffer layer BUF. The first insulating layer IL1 may cover the first active pattern ACT1 and may be disposed along a profile of the first active pattern ACT1 to have a uniform thickness. In another embodiment, the first insulating layer IL1 may sufficiently cover the first active pattern ACT1 and may have a substantially flat upper surface without creating a step adjacent to the first active pattern ACT1. For example, the first insulating layer IL1 may include an inorganic material such as silicon oxide ($SiO_x$), silicon nitride ($SiN_x$), silicon carbide ($SiC_x$), silicon oxynitride ($SiO_xN_y$), silicon oxycarbide ($SiO_xC_y$), and the like. The inorganic material may be used alone or in combination with each other. The first insulating layer IL1 may be referred to as a first inorganic insulating layer.

The first gate electrode GE1 may be disposed in the display area DA on the first insulating layer IL1. The first gate electrode GE1 may overlap the first channel region of the first active pattern ACT1 in a plan view. The first gate electrode GE1 may include a metal, an alloy, a metal nitride, a conductive metal oxide, a transparent conductive material, or the like. For example, the metal may include silver (Ag), molybdenum (Mo), aluminum (Al), tungsten (W), copper (Cu), nickel (Ni), chromium (Cr), titanium (Ti), tantalum (Ta), platinum (Pt), scandium (Sc), or the like. For example, the conductive metal oxide may include indium tin oxide, indium zinc oxide, or the like. For example, the metal nitride may include aluminum nitride ($AlN_x$), tungsten nitride ($WN_x$), chromium nitride ($CrN_x$), or the like. The metal, the alloy, the metal nitride, the conductive metal oxide, the transparent conductive material, or the like may be used individually or in combination with each other.

The second insulating layer IL2 may be disposed on the first insulating layer IL1. The second insulating layer IL2 may cover the first gate electrode GE1 and may be disposed along a profile of the first gate electrode GE1 to have a uniform thickness. In another embodiment, the second insulating layer IL2 may sufficiently cover the first gate electrode GE1 and may have a substantially flat upper surface without creating a step adjacent to the first gate electrode GE1. For example, the second insulating layer IL2 may include an inorganic material such as silicon oxide, silicon nitride, silicon oxynitride, and the like. The inorganic material may be used alone or in combination with each other. The second insulating layer IL2 may be referred to as a second inorganic insulating layer.

The second gate electrode GE2 may be disposed in the display area DA on the second insulating layer IL2. The second gate electrode GE2 may overlap the first gate electrode GE1 in a plan view. For example, the second gate electrode GE2 may include a metal, an alloy, a metal nitride, a conductive metal oxide, a transparent conductive material, or the like. For example, the first gate electrode GE1 and the second gate electrode GE2 may include a same material. The metal, the alloy, the metal nitride, the conductive metal oxide, the transparent conductive material, or the like may be used alone or in combination with each other.

The third insulating layer IL3 may be disposed on the second insulating layer IL2 and the second gate electrode GE2. The third insulating layer IL3 may cover the second gate electrode GE2 and may be disposed along a profile of the second gate electrode GE2 to have a uniform thickness. In another embodiment, the third insulating layer IL3 may sufficiently cover the second gate electrode GE2 and may have a substantially flat upper surface without creating a step adjacent to the second gate electrode GE2. For example, the third insulating layer IL3 may include an inorganic material such as silicon oxide, silicon nitride, silicon oxynitride, and the like. The inorganic material may be used alone or in combination with each other. The third insulating layer IL3 may be referred to as a third inorganic insulating layer.

The second active pattern ACT2 may be disposed in the display area DA on the third insulating layer IL3. In an embodiment, the second active pattern ACT2 may include a metal oxide semiconductor. For example, the second active pattern ACT2 may have a second source region, a second drain region, and a second channel region positioned between the second source region and the second drain region.

The metal oxide semiconductor may include a binary compound ($AB_x$), a ternary compound ($AB_xC_y$), a quaternary compound ($AB_xC_yD_z$), or the like including indium (In), zinc (Zn), gallium (Ga), tin (Sn), titanium (Ti), aluminum (Al), hafnium (Hf), zirconium (Zr), magnesium (Mg), or the like. For example, the metal oxide semiconductor may include zinc oxide ($ZnO_x$), gallium oxide ($GaO_x$), tin oxide ($SnO_x$), indium oxide ($InO_x$), indium gallium oxide (IGO), indium zinc oxide (IZO), indium tin oxide. (ITO), indium zinc tin oxide (IZTO), indium gallium zinc oxide (IGZO), or the like. The binary compound ($AB_x$), the ternary compound ($AB_xC_y$), the quaternary compound ($AB_xC_yD_z$), or the like may be used alone or in combination with each other.

The fourth insulating layer IL4 may be disposed on the third insulating layer IL3 and the second active pattern ACT2. The fourth insulating layer IL4 may cover the second active pattern ACT2 and may be disposed along a profile of the second active pattern ACT2 to have a uniform thickness. In another embodiment, the fourth insulating layer IL4 may sufficiently cover the second active pattern ACT2 and may have a substantially flat upper surface without creating a step adjacent to the second active pattern ACT2. For example, the fourth insulating layer IL4 may include an inorganic material such as silicon oxide, silicon nitride, silicon oxynitride, and the like. The inorganic material may be used alone or in combination with each other. The fourth insulating layer IL4 may be referred to as a fourth inorganic insulating layer.

The third gate electrode GE3 may be disposed in the display area DA on the fourth insulating layer IL4. The third gate electrode GE3 may overlap the second channel region of the second active pattern ACT2 in a plan view. For example, the third gate electrode GE3 may include a metal, an alloy, a metal nitride, a conductive metal oxide, a transparent conductive material, or the like. For example, the first gate electrode GE1, the second gate electrode GE2, and the third gate electrode GE3 may include a same material. The metal, the alloy, the metal nitride, the conductive metal oxide, the transparent conductive material, or the like may be used alone or in combination with each other.

The fifth insulating layer IL5 may be disposed on the fourth insulating layer IL4 and the third gate electrode GE3. The fifth insulating layer IL5 may sufficiently cover the third gate electrode GE3 and may have a substantially flat upper surface without creating a step adjacent to the third gate electrode GE3. In another embodiment, the fifth insulating layer IL5 may cover the third gate electrode GE3 and may be disposed along a profile of the third gate electrode GE3 to have a uniform thickness. For example, the fifth insulating layer IL5 may include an inorganic material such as silicon oxide, silicon nitride, silicon oxynitride, and the like. The inorganic material may be used alone or in combination with each other. The fifth insulating layer IL5 may be referred to as a fifth inorganic insulating layer.

The first source electrode SE1 and a first drain electrode DE1 may be disposed in the display area DA on the fifth insulating layer IL5. The first source electrode SE1 may be connected to the first source region of the first active pattern ACT1 through a contact hole penetrating a first portion of an inorganic insulating layer (e.g., the first, second, third, fourth, and fifth insulating layers IL1, IL2, IL3, IL4, and IL5). The first drain electrode DE1 may be connected to the first drain region of the first active pattern ACT1 through a contact hole penetrating a second portion of the inorganic insulating layer. For example, each of the first source electrode SE1 and the first drain electrode DE1 may include a metal, an alloy, a metal nitride, a conductive metal oxide, a transparent conductive material, or the like. The metal, the alloy, the metal nitride, the conductive metal oxide, the transparent conductive material, or the like may be used alone or in combination with each other. In an embodiment, each of the first source electrode SE1 and the first drain electrode DE1 may have a multilayer structure of Ti/Al/Ti.

The second source electrode SE2 and the second drain electrode DE2 may be disposed in the display area DA on the fifth insulating layer IL5. The second source electrode SE2 may be connected to the second source region of the second active pattern ACT2 through a contact hole penetrating a first portion of the fourth and fifth insulating layers IL4 and IL5. The second drain electrode DE2 may be connected to the second drain region of the second active pattern ACT2 through a contact hole penetrating the second portions of the fourth and fifth insulating layers IL4 and IL5.

The second source electrode SE2 and the second drain electrode DE2 and the first source electrode SE1 and the first drain electrode DE1 may include a same material and may be disposed in a same layer.

Accordingly, the first transistor TR1 including the first active pattern ACT1, the first gate electrode GE1, the second gate electrode GE2, the first source electrode SE1, and the first drain electrode DE1 may be disposed in the display area DA, and the second transistor TR2 including the second active pattern ACT2, the third gate electrode GE3, the second source electrode SE2, and the second drain electrode DE2 may be disposed in the display area DA. The first transistor TR1 may be a driving transistor, and the second transistor TR2 may be a switching transistor.

The sixth insulating layer IL6 may be disposed on the fifth insulating layer IL5, the first source electrode SE1, the first drain electrode DE1, the second source electrode SE2, and the second drain electrode DE2. The sixth insulating layer IL6 may sufficiently cover the first source electrode SE1, the first drain electrode DE1, the second source electrode SE2, and the second drain electrode DE2. The sixth insulating layer IL6 may include an organic material. For example, the sixth insulating layer IL6 may include an organic material such as a polyimide resin, a polyamide resin, a siloxane resin, an epoxy resin, and the like. The organic material may be used alone or in combination with each other. The sixth insulating layer IL6 may be a first organic insulating layer.

The connection electrode CE may be disposed in the display area DA on the sixth insulating layer IL6. The connection electrode CE may be connected to the first drain electrode DE1 through a contact hole penetrating the sixth insulating layer IL6. Accordingly, the connection electrode CE may electrically connect the first transistor TR1 and the light emitting element EL. For example, the connection electrode CE may include a metal, an alloy, a metal nitride, a conductive metal oxide, a transparent conductive material, or the like. The metal, the alloy, the metal nitride, the conductive metal oxide, the transparent conductive material, or the like may be used alone or in combination with each other. In an embodiment, the connection electrode CE may have a multilayer structure of Ti/Al/Ti.

The seventh insulating layer IL7 may be disposed on the sixth insulating layer IL6 and the connection electrode CE. The seventh insulating layer IL7 may have a substantially flat upper surface. The seventh insulating layer IL7 may include an organic material. For example, the seventh insulating layer IL7 may include an organic material such as a polyimide resin, a polyamide resin, a siloxane resin, an epoxy resin, and the like. The organic material may be used alone or in combination with each other. The seventh insulating layer IL7 may be referred to as a second organic insulating layer.

The pixel electrode PE may be disposed in the display area DA on the seventh insulating layer IL7. The pixel electrode PE may be connected to the connection electrode CE through a contact hole penetrating the seventh insulating layer IL7. For example, the pixel electrode PE may include a metal, an alloy, a metal nitride, a conductive metal oxide, a transparent conductive material, or the like. The metal, the alloy, the metal nitride, the conductive metal oxide, the transparent conductive material, or the like may be used alone or in combination with each other. For example, the pixel electrode PE may operate as an anode.

The pixel defining layer PDL may be disposed on the seventh insulating layer IL7. The pixel defining layer PDL may cover an edge of the pixel electrode PE. For example, the pixel defining layer PDL may include an inorganic material or an organic material. In an embodiment, the pixel defining layer PDL may include an organic material such as an epoxy resin, a siloxane resin, and the like. The organic material may be used alone or in combination with each other. In another embodiment, the pixel defining layer PDL may further include a light blocking material including a black pigment, a black dye, or the like.

The organic light emitting layer EML may be disposed on the pixel electrode PE and the pixel defining layer PDL. The organic light emitting layer EML may include an organic material that emits light of a color (e.g., a predetermined or selectable color). In an embodiment, the organic light emitting layer EML may include an electron injection layer, an electron transport layer, an emission layer, a hole transport layer, a hole injection layer, or the like.

The common electrode CME may be disposed on the organic light emitting layer EML. For example, the common electrode CME may include a metal, an alloy, a metal nitride, a conductive metal oxide, a transparent conductive material, or the like. The metal, the alloy, the metal nitride, the conductive metal oxide, the transparent conductive material, or the like may be used alone or in combination with each other. For example, the common electrode CME may operate as a cathode.

Accordingly, the light emitting element EL including the pixel electrode PE, the organic light emitting layer EML, and the common electrode CME may be disposed in the display area DA.

The encapsulation layer ENC may be disposed on the common electrode CME. The encapsulation layer ENC may prevent impurities, moisture, and/or the like from permeating the light emitting element EL from an outside. The encapsulation layer ENC may include a first inorganic encapsulation layer EN1, an organic encapsulation layer EN2 disposed on the first inorganic encapsulation layer EN1, and a second inorganic encapsulation layer EN3 disposed on the organic encapsulation layer EN2. For example, each of the first inorganic encapsulation layer EN1 and the second inorganic encapsulation layer EN3 may include silicon oxide, silicon nitride, silicon oxynitride, or the like. The silicon oxide, the silicon nitride, the silicon oxynitride, or the like may be used alone or in combination with each other. The organic encapsulation layer EN2 may include a cured polymer material such as polyacrylate, and the like.

The functional layer FL may be disposed on the encapsulation layer ENC. The functional layer FL may include various layers having various functions to improve user convenience. For example, the functional layer FL may include a polarization layer to prevent reflection of external light, an input detection layer to detect a user's input, a color filter layer to selectively transmit light having a specific wavelength, or the like.

Figure 5:
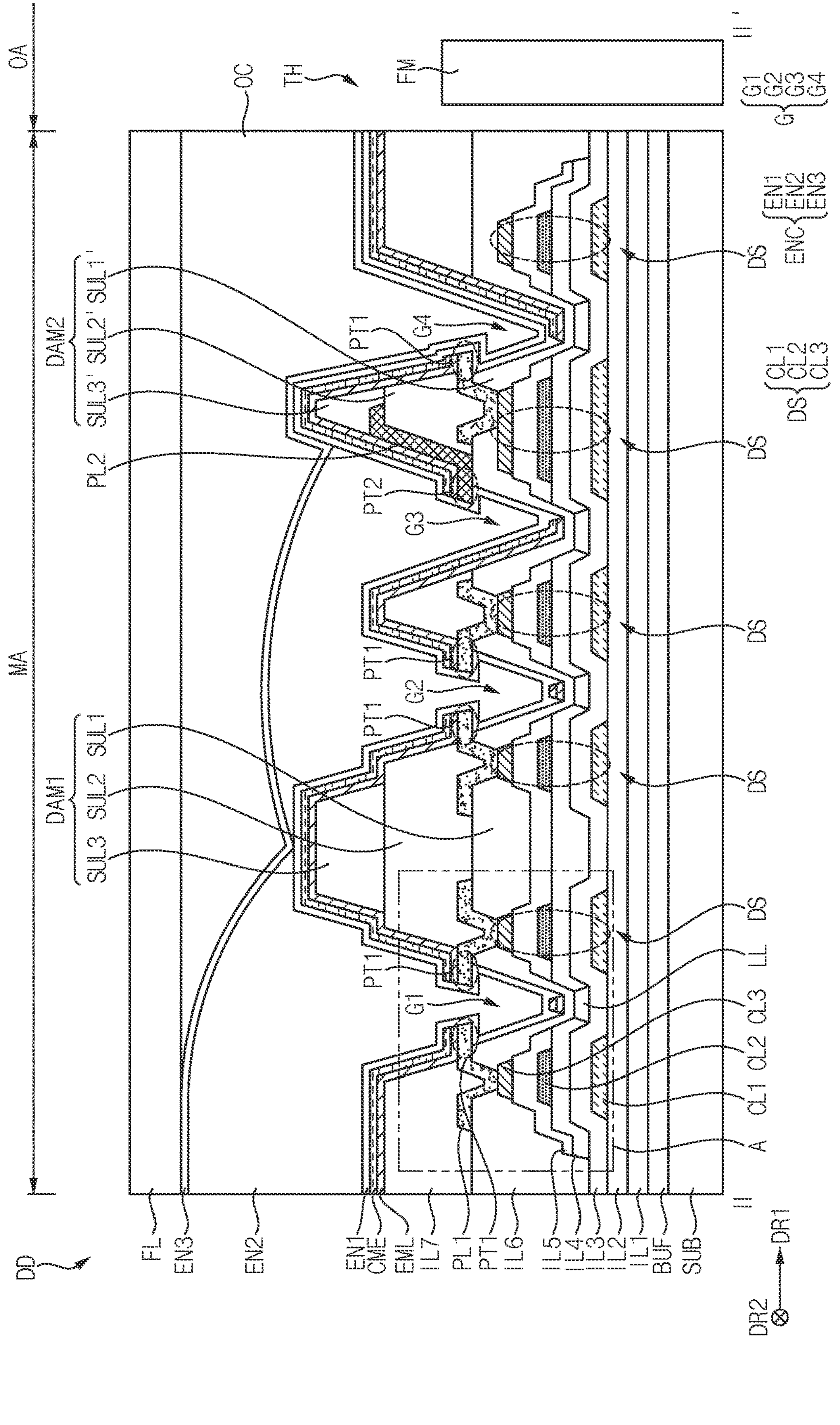
FIG. 5 is a schematic cross-sectional view taken along line II-II' of FIG. 3.
Figure 6:
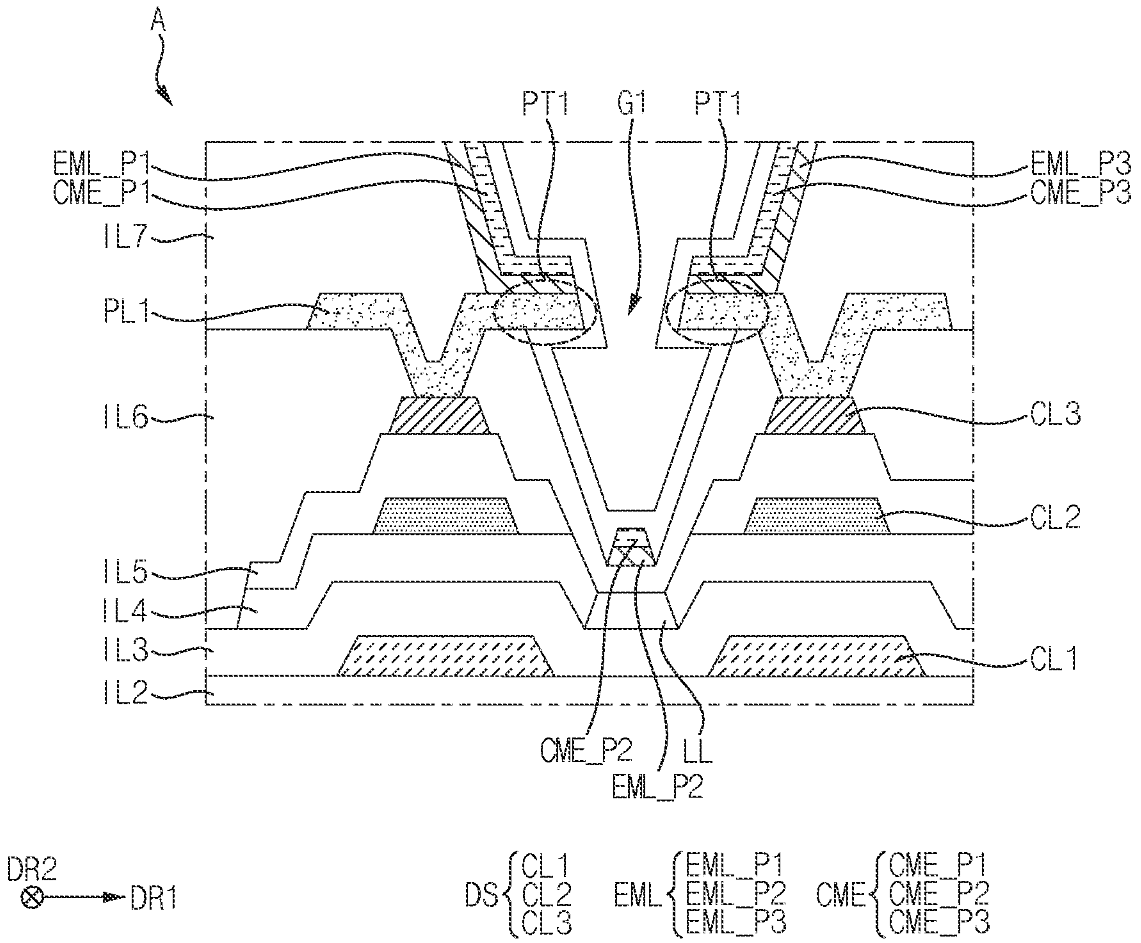
FIG. 6 is a schematic enlarged cross-sectional view of area A of FIG. 5.

FIG. 5 is a schematic cross-sectional view taken along line II-II' of FIG. 3. FIG. 6 is a schematic enlarged cross-sectional view of area A of FIG. 5. Hereinafter, descriptions of the display device DD described with reference to FIG. 4 are omitted or simplified.

Referring to FIGS. 5 and 6, the display device DD according to an embodiment of the disclosure may include dummy stacks DS, lower layers LL, first pattern layers PL1, a second pattern layer PL2, a first dam DAM1, a second dam DAM2, grooves G, and an overcoat layer OC.

The substrate SUB, the buffer layer BUF, the first, second, third, fourth, fifth, sixth, and seventh insulating layers IL1, IL2, IL3, IL4, IL5, IL6, and IL7, the organic light emitting layer EML, the common electrode CE, the encapsulation layer ENC, and the functional layer FL may extend from the display area DA at least to the middle area MA. For example, the substrate SUB, the buffer layer BUF, the first, second, and third insulating layers IL1, IL2, and IL3, the first inorganic encapsulation layer EN1, the second inorganic encapsulation layer EN3, and the functional layer FL may continuously extend from the display area DA to the middle area MA. The fourth, fifth, sixth, and seventh insulating layers IL4, IL5, IL6, and IL7 and the organic encapsulation layer EN2 may be disposed only on a portion of the middle area MA.

The grooves G may be disposed in the middle area MA on the substrate SUB. Each of the grooves G may penetrate at least one insulating layer. In an embodiment, each of the grooves G may penetrate the sixth insulating layer IL6. For example, each of the grooves G may be formed by removing a portion of the sixth insulating layer IL6. In another embodiment, each of the grooves G may further penetrate insulating layers (e.g., the fourth and fifth insulating layers IL4 and IL5) disposed under the sixth insulating layer IL6. The groove G may block moisture or the like that may be introduced through the substrate SUB.

The grooves G may include a first, a second, a third, and a fourth grooves G1, G2, G3, and G4. For example, the number of grooves G may be four. However, the number of grooves G is not limited thereto.

The dummy stacks DS may be disposed in the middle area MA on (or over) the substrate SUB. For example, each of the dummy stacks DS may be disposed adjacent to the groove G. Each of the dummy stacks DS may be a mound, and may increase a depth of the groove G.

In an embodiment, each of the dummy stacks DS may include a first conductive layer CL1 disposed on the second insulating layer IL2, a second conductive layer CL2 disposed on the fourth insulating layer IL4, and a third conductive layer CL3 disposed on the fifth insulating layer IL5. The first, second, and third conductive layers CL1, CL2, and CL3 may overlap with each other in a plan view. For example, the first conductive layer CL1 and a second gate electrode (see, e.g., the second gate electrode GE2 of FIG. 4) may include a same material, the second conductive layer CL2 and a third gate electrode (see, e.g., the third gate electrode GE3 of FIG. 4) may include a same material, and the third conductive layer CL3, a source electrode (see, e.g., the first and second source electrodes SE1 and SE2 of FIG. 4), and a drain electrode (see, e.g., the first and second drain electrode DE1 and DE2 of FIG. 4)_may include a same material.

Although the number of dummy stacks DS is illustrated as six in FIG. 5, the number of dummy stacks DS is not limited thereto.

The lower layers LL may be disposed in the middle area MA on the third insulating layer IL3. Each of the lower layers LL may be disposed under the groove G. The lower layers LL may function as an etching stopper during an etching process for forming the groove G.

Each of the lower layers LL may be disposed under each of the first, second, third, and fourth grooves G1, G2, G3, and G4. At least a portion of an upper surface of each of the lower layers LL may be exposed by the fourth and fifth insulating layers IL4 and IL5. For example, the lower layers LL and the second active pattern (see, e.g., the second ACT2 of FIG. 4) may include a same material.

The first pattern layers PL1 may be disposed in the middle area MA on the sixth insulating layer IL6. Each of the first pattern layers PL1 may be disposed adjacent to the groove G. For example, each of the first pattern layers PL1 may be disposed adjacent to at least a side of the groove G. In an embodiment, some of the first pattern layers PL1 may be disposed adjacent to both sides of each of the first and second grooves G1 and G2, and another portion of the first pattern layers PL1 may be disposed adjacent to a side of the fourth groove G4. Each of the first pattern layers PL1 may be connected to the dummy stack DS (i.e., the third conductive layer CL3) through a contact hole penetrating the sixth insulating layer IL6.

The first pattern layers PL1 and the connection electrode (see, e.g., the connection electrode CE of FIG. 4) may include a same material. For example, the first pattern layers PL1 may include an opaque material (e.g., a metal).

In an embodiment, an end of each of the first pattern layers PL1 may have a first tip PT1 protruding toward the groove G. For example, an end of the first pattern layer PL1 adjacent to the first groove G1 may be the first tip PT1 protruding toward the first groove G1. An end of the first pattern layer PL1 adjacent to the second groove G2 may be the first tip PT1 protruding toward the second groove G2. An end of the first pattern layer PL1 adjacent to the fourth groove G4 may be the first tip PT1 protruding toward the fourth groove G4.

Although the number of first pattern layers PL1 is illustrated as five in FIG. 5, the number of first pattern layers PL1 is not limited thereto.

In an embodiment, at least one second pattern layer PL2 may be disposed in the middle area MA on the substrate SUB. For example, the second pattern layer PL2 may be disposed on a portion of a first sub-layer SUL1' of the second dam DAM2 and may extend along a side surface of a second sub-layer SUL2' to a portion of an upper surface of the second sub-layer SUL2'.

The second pattern layer PL2 may be disposed adjacent to a groove G (e.g., the third groove G3). For example, the second pattern layer PL2 may be disposed adjacent to at least a side of the groove G. In an embodiment, the second pattern layer PL2 may be disposed adjacent to a side of the third groove G3.

In an embodiment, an end of the second pattern layer PL2 may have a second tip PT2 protruding toward the groove G. For example, an end of the second pattern layer PL2 adjacent to the third groove G3 may be the second tip PT2 protruding toward the third groove G3.

The second pattern layer PL2 may include a transparent material. For example, the second pattern layer PL2 may include a conductive metal oxide, a silicon compound, or the like.

In an embodiment, the conductive metal oxide may include indium gallium oxide (IGO), indium zinc oxide (IZO), indium tin oxide (ITO), indium zinc tin oxide (IZTO), indium gallium zinc oxide (IGZO), or the like, and the silicon compound may include silicon oxide, silicon nitride, silicon oxynitride, or the like. The conductive metal oxide, the silicon compound, or the like may be used alone or in combination with each other. However, the disclosure is not limited thereto, and the second pattern layer PL2 may include various transparent materials.

Although the number of second pattern layers PL2 is illustrated in FIG. 5 as one, the number of second pattern layers PL2 is not limited thereto. In another embodiment, the second pattern layer PL2 may not be disposed in the middle area MA, and the second pattern layer PL2 may be disposed in another area (e.g., a non-display area (see, e.g., the non-display area NDA of FIG. 1)). A detailed description of this will be described below.

The first tip PT1 may be positioned on at least one of the grooves G (or at least one side of the grooves G). In an embodiment, the first tip PT1 may be positioned on both sides of each of the first groove G1 and the second groove G2 and a side of the fourth groove G4. For example, the first tip PT1 may be positioned on a side of the fourth groove G4 adjacent to the second dam DAM2. The first tip PT1 may not be positioned on the third groove G3. For example, on some of the grooves G, the first tip PT1 may be positioned on both sides, on another grooves G, the first tip PT1 may be positioned on a side, and on the other grooves G, the first tip PT1 may not be positioned.

The second tip PT2 may be positioned on at least one of the grooves G (or at least one side of the grooves G). In an embodiment, the second tip PT2 may be positioned on a side of the third groove G3. The second tip PT2 may be positioned on a side of the third groove G3 adjacent to the second dam DAM2. The second tip PT2 may not be positioned on the first groove G1, the second groove G2, and the fourth groove G4.

The first dam DAM1 and the second dam DAM2 may be disposed in the middle area MA on the substrate SUB. The first dam DAM1 and the second dam DAM2 may be spaced apart from each other in a plan view. The first dam DAM1 and the second dam DAM2 may be arranged in a direction (i.e., the first direction D1) from the display area DA toward the opening area OA. The first dam DAM1 may be disposed on the fifth insulating layer IL5 between the first groove G1 and the second groove G2. The second dam DAM2 may be disposed on the fifth insulating layer IL5 between the third groove G3 and the fourth groove G4. The first dam DAM1 and the second dam DAM2 may serve to prevent the organic encapsulation layer EN2 disposed in the display area DA from overflowing into the opening area OA. However, the disclosure is not limited thereto, and various numbers of dams may be disposed in the middle area MA on the substrate SUB.

In an embodiment, the first dam DAM1 may include sequentially disposed a first, a second, and a third sub-layers SUL1, SUL2, and SUL3, and the second dam DAM2 may include sequentially disposed a first, a second, and a third sub-layers SUL1', SUL2', and SUL3'. The first sub-layers SUL1 and SUL1' and the sixth insulating layer IL6 may include a same material, the second sub-layers SUL2 and SUL2' and the seventh insulating layer IL7 may include a same material, and the third sub-layers SUL3 and SUL3' and a pixel defining layer (see, e.g., the pixel defining layer PDL of FIG. 4) may include a same material.

In the middle area MA, the organic light emitting layer EML and the common electrode CME may be disposed on the seventh insulating layer IL7, the first dam DAM1, and the second dam DAM2. However, the organic light emitting layer EML and the common electrode CME may be disconnected from an area in which the grooves G are disposed. The organic light emitting layer EML and the common electrode CME may be disconnected at the first tip PT1 positioned on the first groove G1. For example, as illustrated in FIG. 6, a first portion EML_P1 of the organic light emitting layer EML and a first portion CME_P1 of the common electrode CME may be sequentially stacked on the seventh insulating layer IL7 adjacent to the display area DA, a second portion EML_P2 of the organic light emitting layer EML and a second portion CME_P2 of the common electrode CME may be sequentially stacked on the sixth insulating layer IL6 inside the first groove G1, and a third portion EML_P3 of the organic light emitting layer EML and a third portion CME_P3 of the common electrode CME may be sequentially stacked on the first dame DAM1 (see, e.g., FIG. 5).

Similarly, the organic light emitting layer EML and the common electrode CME may be disconnected at the first tip PT1 positioned on the second groove G2 and the fourth groove G4. The organic light emitting layer EML and the common electrode CME may be disconnected at the second tip PT2 positioned on the third groove G3.

The first inorganic encapsulation layer EN1 may be disposed on the common electrode CME and may cover the first, second, third, and fourth grooves G1, G2, G3, and G4. The organic encapsulation layer EN2 may be disposed on the first inorganic encapsulation layer EN1 and may fill the first, second, and third grooves G1, G2, and G3. The organic encapsulation layer EN2 may not fill the fourth groove G4. The second inorganic encapsulation layer EN3 may be disposed (e.g., entirely disposed) on the organic encapsulation layer EN2 in the middle area MA and may cover the fourth groove G4. For example, in the middle area MA, the second inorganic encapsulation layer EN3 may contact (e.g., directly contact) the first inorganic encapsulation layer EN1 in an area in which the organic encapsulation layer EN2 is not disposed.

The overcoat layer OC may be disposed in the middle area MA on the second inorganic encapsulation layer EN3. The overcoat layer OC may have a substantially flat upper surface. The overcoat layer OC may compensate for a step formed by the organic encapsulation layer EN2 blocked by the dams DAM1 and DAM2. For example, an upper surface of the overcoat layer OC and an uppermost surface of the second inorganic encapsulation EN3 may be positioned at substantially a same level. The overcoat layer OC may fill the fourth groove G4. For example, the overcoat layer OC may include an organic material. The functional layer FL may be disposed on the overcoat layer OC.

The through hole TH may be formed in the opening area OA penetrating a portion (e.g., a substrate SUB, insulating layers IL1, IL2, IL3, IL4, IL5, IL6, and IL7, an encapsulation layer ENC, and a functional layer FL of FIG. 4) of the display device DD. The functional module FM may be disposed in the through hole TH.

In the middle area MA, in order to monitor whether the organic light emitting layer EML and the common electrode CME are disconnected, a critical dimension of the first tip PT1 of the first pattern layer PL1 may need to be measured. However, since the first pattern layer PL1 includes an opaque material, light may not be transmitted through the first pattern layer PL1. Therefore, there is a limit measuring the critical dimension of the first tip PT1 of the first pattern layer PL1.

The display device DD according to an embodiment of the disclosure may include multiple first pattern layers PL1 disposed in the functional area FA, including an opaque material, an end of each of the first pattern layers PL1 having a first tip PT1 protruding toward the first groove G1, and at least one second pattern layer PL2 disposed in a non-display area (e.g., the functional area FA), including a transparent material, an end of the second pattern layer PL2 having a second tip PT2 protruding toward the second groove G2. Accordingly, the critical dimension of the first tip PT1 of the first pattern layer PL1 may be predicted by measuring a critical dimension of the second tip PT2 of the second pattern layer PL2. Through measuring the critical dimension of the second tip PT2 of the second pattern layer PL2, it may be possible to monitor whether the organic light emitting layer EML and the common electrode CME are disconnected in the functional area FA.

Figure 7:
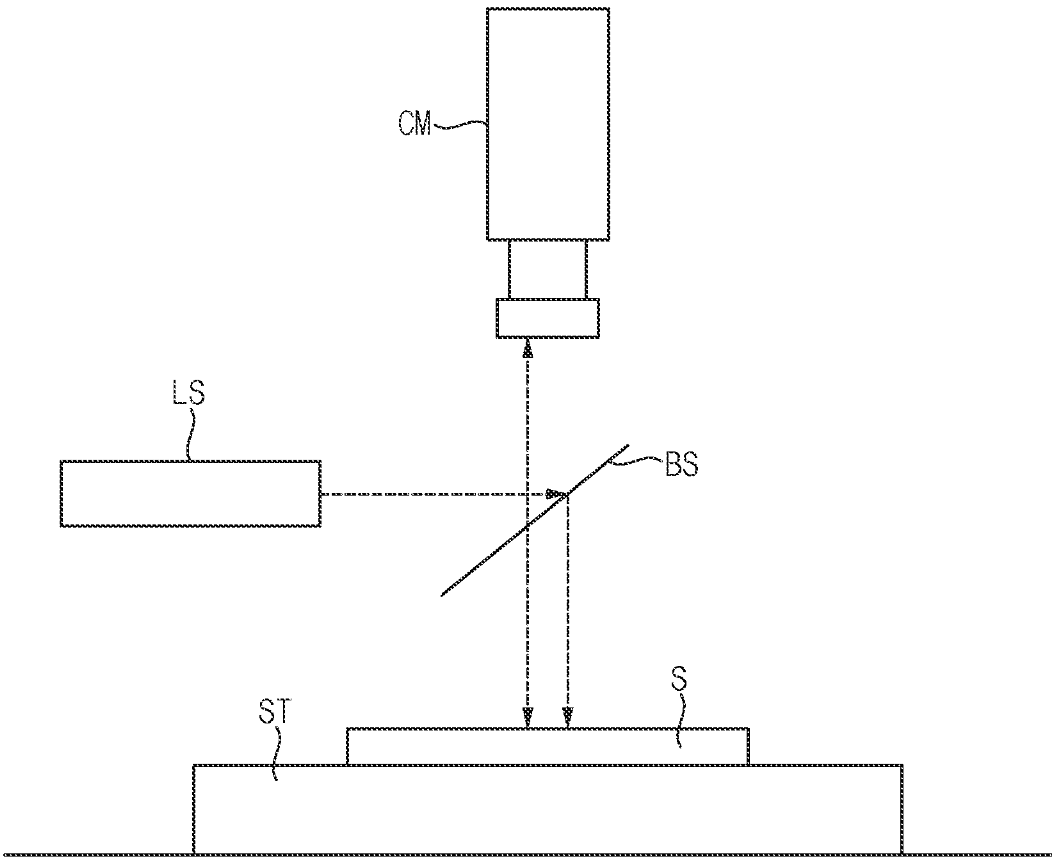
FIG. 7 is a schematic view illustrating a critical dimension measuring apparatus for measuring a critical dimension of a test subject.

FIG. 7 is a schematic view illustrating a critical dimension measuring apparatus for measuring a critical dimension of a test subject.

Referring to FIG. 7, the critical dimension measurement apparatus may include a stage ST, a light source LS, a beam splitter BS, and a camera module CM.

First, a test subject S may be positioned on the stage ST. For example, the test object S may be a component (e.g., a substrate, an insulating layer, a conductive layer, and the like) included in a display device (see, e.g., the display device DD of FIGS. 1 to 6).

The light source LS may emit light toward the beam splitter BS. Some of the light incident on the beam splitter BS may be reflected and incident on the test subject S. Some of the light incident on the test subject S may be reflected, pass through the beam splitter BS, and may be incident on the camera module CM. In case that the test subject S includes the insulating layer and the conductive layer, a degree of light reflection may vary depending on a type of the insulating layer and the conductive layer. Through an intensity difference of the reflected light, the critical dimension of the test subject S may be measured. For example, the critical dimension measurement apparatus may be used to measure the critical dimensions of the tips PT1 and PT2 of the pattern layers PL1 and PL2 illustrated in FIG. 5.

FIGS. 8 to 21 are schematic cross-sectional views illustrating a manufacturing method of the display device of FIGS. 4 and 5.

Figure 8:
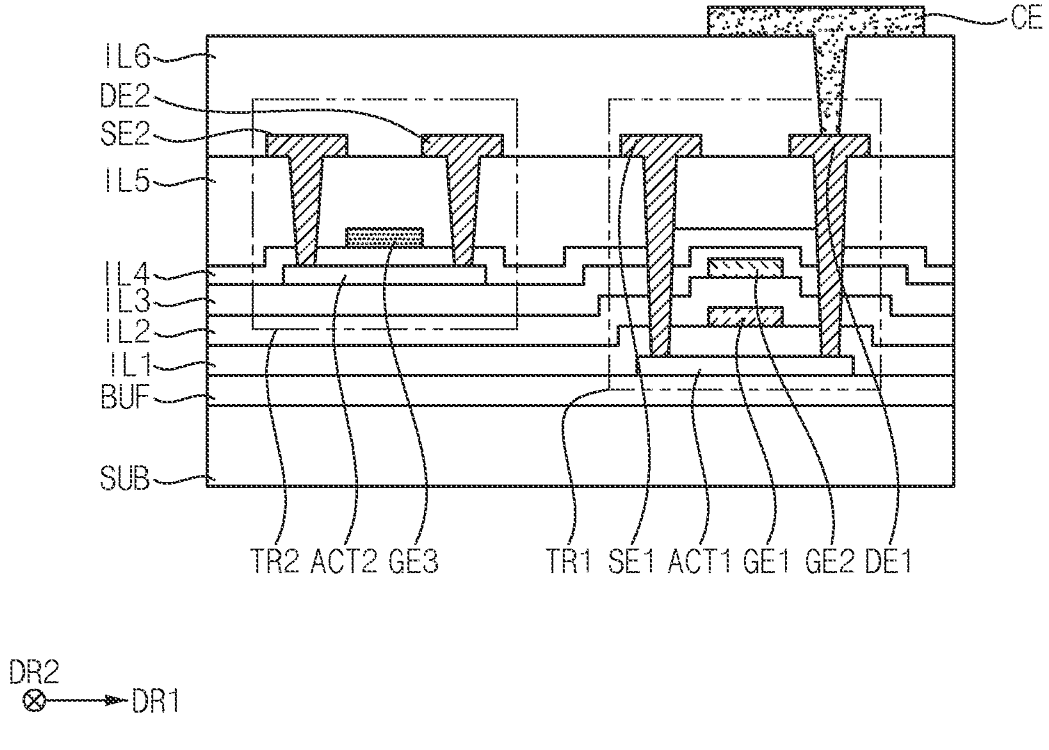
FIGS. 8 to 21 are schematic cross-sectional views illustrating a manufacturing method of the display device of FIGS. 4 and 5.
Figure 9:
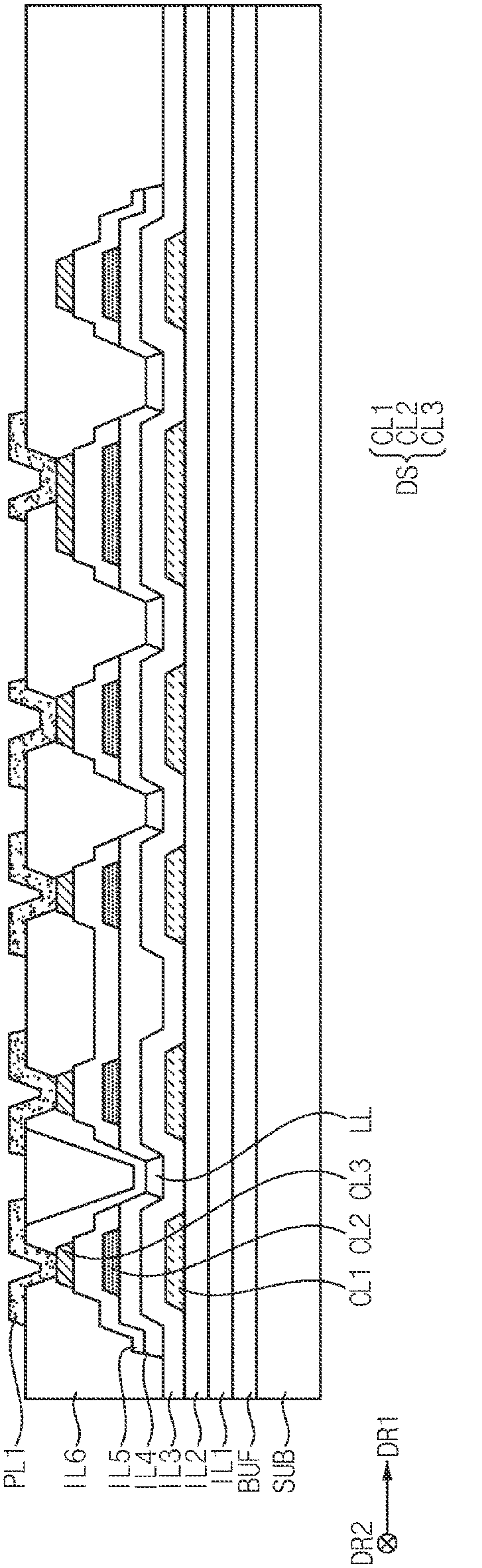

Referring to FIGS. 8 and 9, the buffer layer BUF may be formed on the substrate SUB, and the first active pattern ACT1 may be formed on the buffer layer BUF. The first active pattern ACT1 may be formed in a display area (see, e.g., the display area DA of FIG. 4). For example, the first active pattern ACT1 may be formed using an inorganic semiconductor.

The first insulating layer IL1 may be formed on the buffer layer BUF. The first insulating layer IL1 may be formed (e.g., entirely formed) in the display area and a functional area (see, e.g., the functional area FA of FIG. 3). For example, the first insulating layer IL1 may be formed using an inorganic material.

The first gate electrode GE1 may be formed in the display area on the first insulating layer IL1. The first gate electrode GE1 may be formed to overlap the first channel region of the first active pattern ACT1 in a plan view.

The second insulating layer IL2 may be formed on the first insulating layer IL1. The second insulating layer IL2 may be formed (e.g., entirely formed) in the display area and the functional area. For example, the second insulating layer IL2 may be formed using an inorganic material.

The second gate electrode GE2 may be formed in the display area on the second insulating layer IL2. The second gate electrode GE2 may be formed to overlap the first gate electrode GE1 in a plan view. The first conductive layers CL1 may be formed in the functional area on the second insulating layer IL2. The first conductive layers CL1 and the second gate electrode GE2 may be simultaneously formed through a same process.

The third insulating layer IL3 may be formed on the second insulating layer IL2. The third insulating layer IL3 may be formed (e.g., entirely formed) in the display area and the functional area. The third insulating layer IL3 may cover the second gate electrode GE2 in the display area and the first conductive layers CL1 in the functional area. For example, the third insulating layer IL3 may be formed using an inorganic material.

The second active pattern ACT2 may be formed in the display area on the third insulating layer IL3. The second active pattern ACT2 may be formed using an oxide semiconductor. The lower layers LL may be formed in the functional area on the third insulating layer IL3. Each of the lower layers LL may be formed between the first conductive layers CL1. The lower layers LL and the second active pattern ACT2 may be simultaneously formed through a same process.

The fourth insulating layer IL4 may be formed on the third insulating layer IL3. The fourth insulating layer IL4 may be formed (e.g., entirely formed) in the display area and be patterned to overlap each of the first conductive layers CL1 in the functional area in a plan view and expose at least a portion of an upper surface of each of the lower layers LL. For example, the fourth insulating layer IL4 may be formed using an inorganic material.

The third gate electrode GE3 may be formed on the fourth insulating layer IL4 in the display area. The third gate electrode GE3 may be formed to overlap the second channel region of the second active pattern ACT2 in a plan view. The second conductive layers CL2 may be formed in the functional area on the fourth insulating layer IL4. The second conductive layers CL2 may each overlap the first conductive layers CL1 in a plan view. The second conductive layers CL2 and the third gate electrode GE3 may be simultaneously formed through a same process.

The fifth insulating layer IL5 may be formed on the fourth insulating layer IL4. The fifth insulating layer IL5 may be formed (e.g., entirely formed) in the display area and be patterned to overlap the fourth insulating layer IL4 in the functional area in a plan view. For example, the fifth insulating layer IL5 may be formed using an inorganic material.

The first source electrode SE1 and the first drain electrode DE1 may be formed in the display area on the fifth insulating layer IL5. The first source electrode SE1 may be connected to the first source region of the first active pattern ACT1 through a contact hole formed by removing a first portion of the first, second, third, fourth, and fifth insulating layers IL1, IL2, IL3, IL4, and IL5. The first drain electrode DE1 may be connected the first drain region of the first active pattern ACT1 through a contact hole formed by removing a second portion of the first, second, third, fourth, and fifth insulating layers IL1, IL2, IL3, IL4, and IL5.

The second source electrode SE2 and the second drain electrode DE2 may be formed in the display area on the fifth insulating layer IL5. The second source electrode SE2 may be connected to the second source region of the second active pattern ACT2 through a contact hole formed by removing a first portion of the fourth and fifth insulating layers IL4 and IL5. The second drain electrode DE2 may be connected to the second drain region of the second active pattern ACT2 through a contact hole formed by removing a second portion of the fourth and fifth insulating layers IL4 and IL5.

The third conductive layers CL3 may be formed in the functional area on the fifth insulating layer IL5. The third conductive layers CL3 may each overlap the second conductive layers CL2 in a plan view. The third conductive layers CL3, the first and second source electrodes SE1 and SE2, and the first and second drain electrodes DE1 and DE2 may be simultaneously formed through a same process.

The sixth insulating layer IL6 may be formed on the fifth insulating layer IL5. The sixth insulating layer IL6 may be formed (e.g., entirely formed) in the display area and the functional area. For example, the sixth insulating layer IL6 may be formed using an organic material.

The connection electrode CE may be formed in the display area on the sixth insulating layer IL6. The connection electrode CE may be connected to the first drain electrode DE1 through a contact hole formed by removing a portion of the sixth insulating layer IL6. The first pattern layers PL1 may be formed in the functional area on the sixth insulating layer IL6. Each of the first pattern layers PL1 may be connected to the third conductive layer CL3 through a contact hole formed by removing a portion of the sixth insulating layer IL6. The first pattern layers PL1 and the connection electrode CE may be simultaneously formed through a same process.

Figure 10:
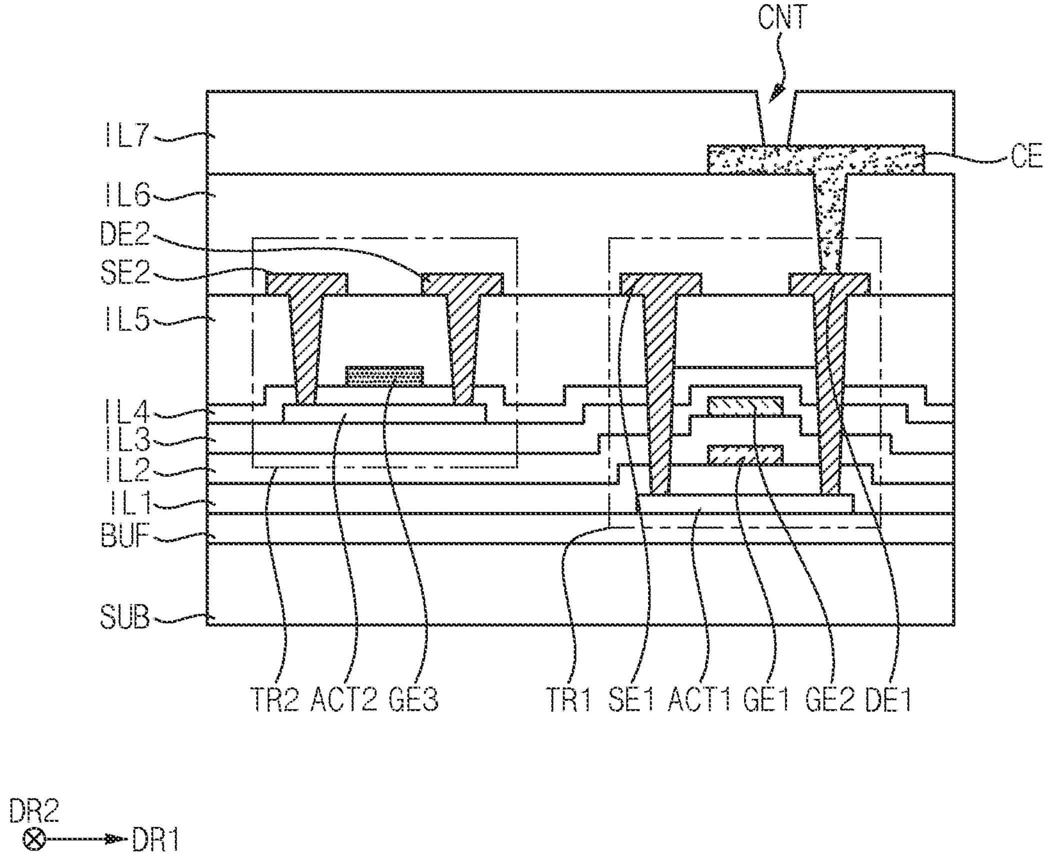
Figure 11:
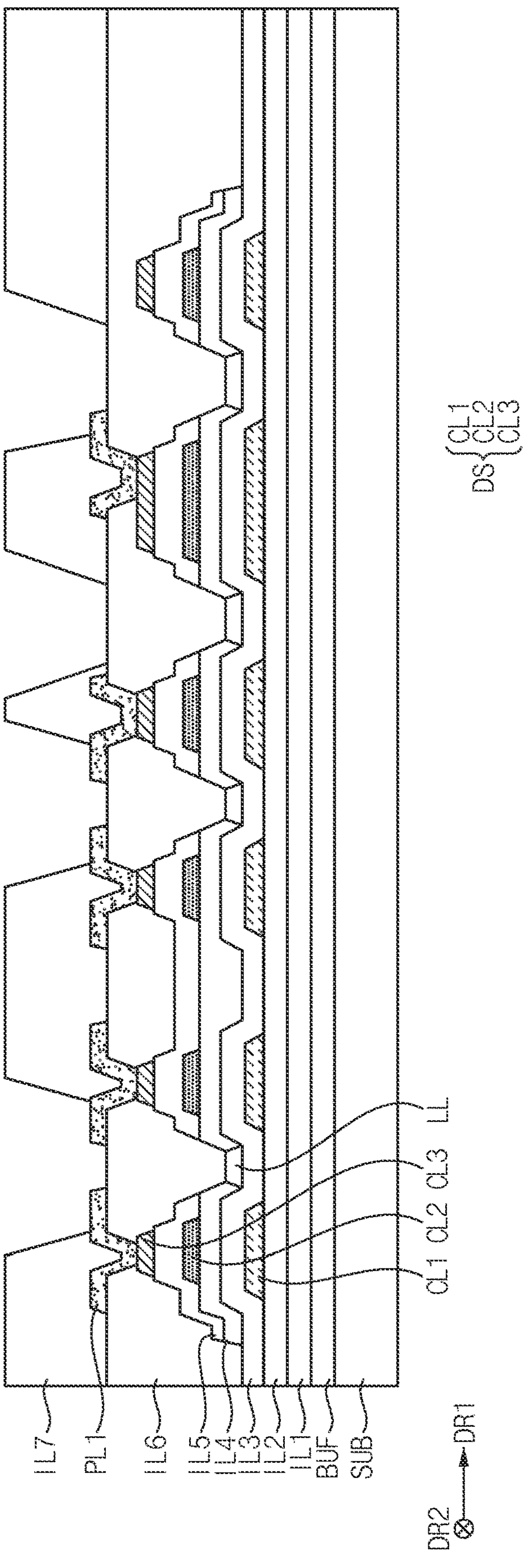

Referring to FIGS. 10 and 11, the seventh insulating layer IL7 may be formed on the sixth insulating layer IL6. The seventh insulating layer IL7 may be formed (e.g., entirely formed) in the display area and the functional area. A contact hole CNT may be formed in the display area by removing a portion of the seventh insulating layer IL7 to expose a portion of the connection electrode CE.

In the functional area, a portion of the seventh insulating layer IL7 overlapping the lower layers LL and an end of each of the first pattern layers PL1 adjacent to the lower layers LL in a plan view may be removed. For example, in the functional area, an opening overlapping the lower layers LL and an end of each of the first pattern layers PL1 adjacent to the lower layers LL in a plan view may be formed by removing a portion of the seventh insulating layer IL7. The opening and the contact hole CNT may be simultaneously formed through a same process. For example, the seventh insulating layer IL7 may be formed using an organic material.

Figure 12:
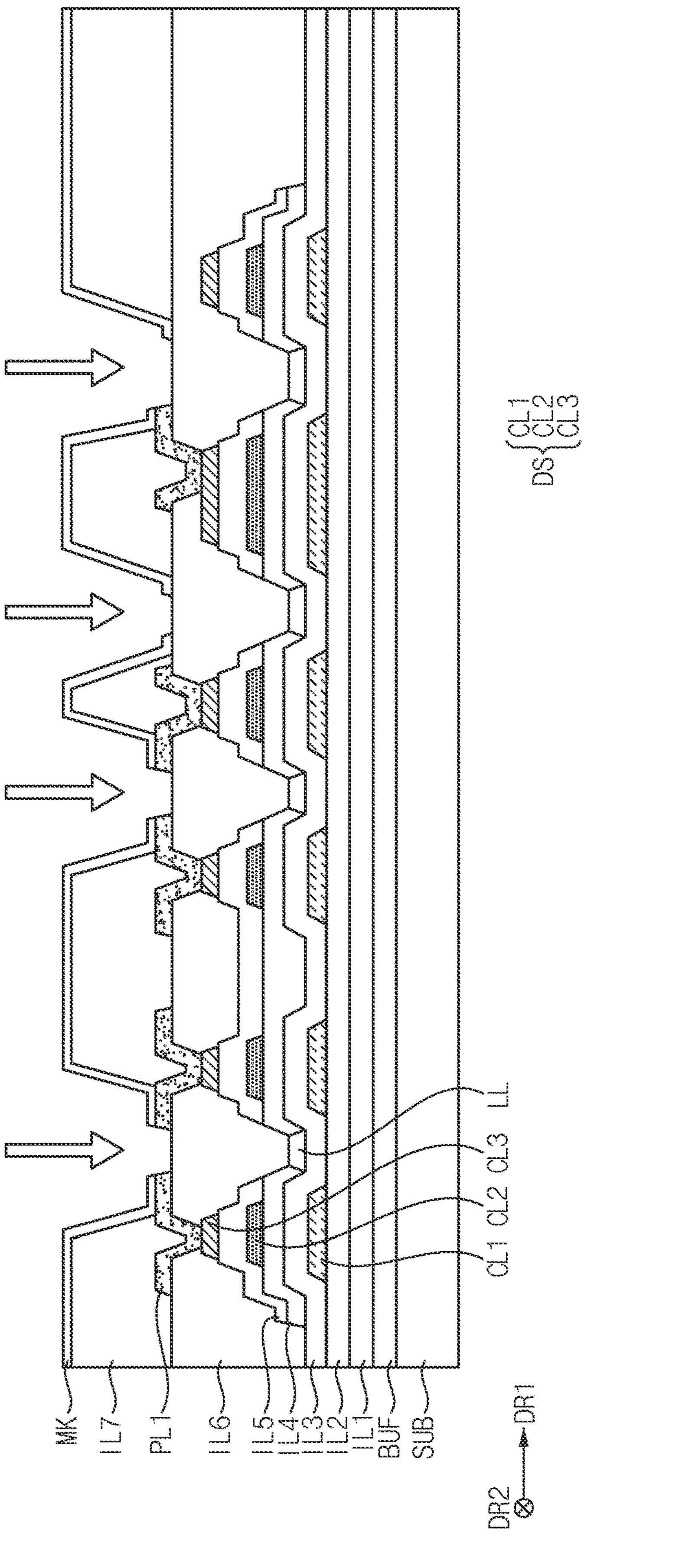
Figure 13:
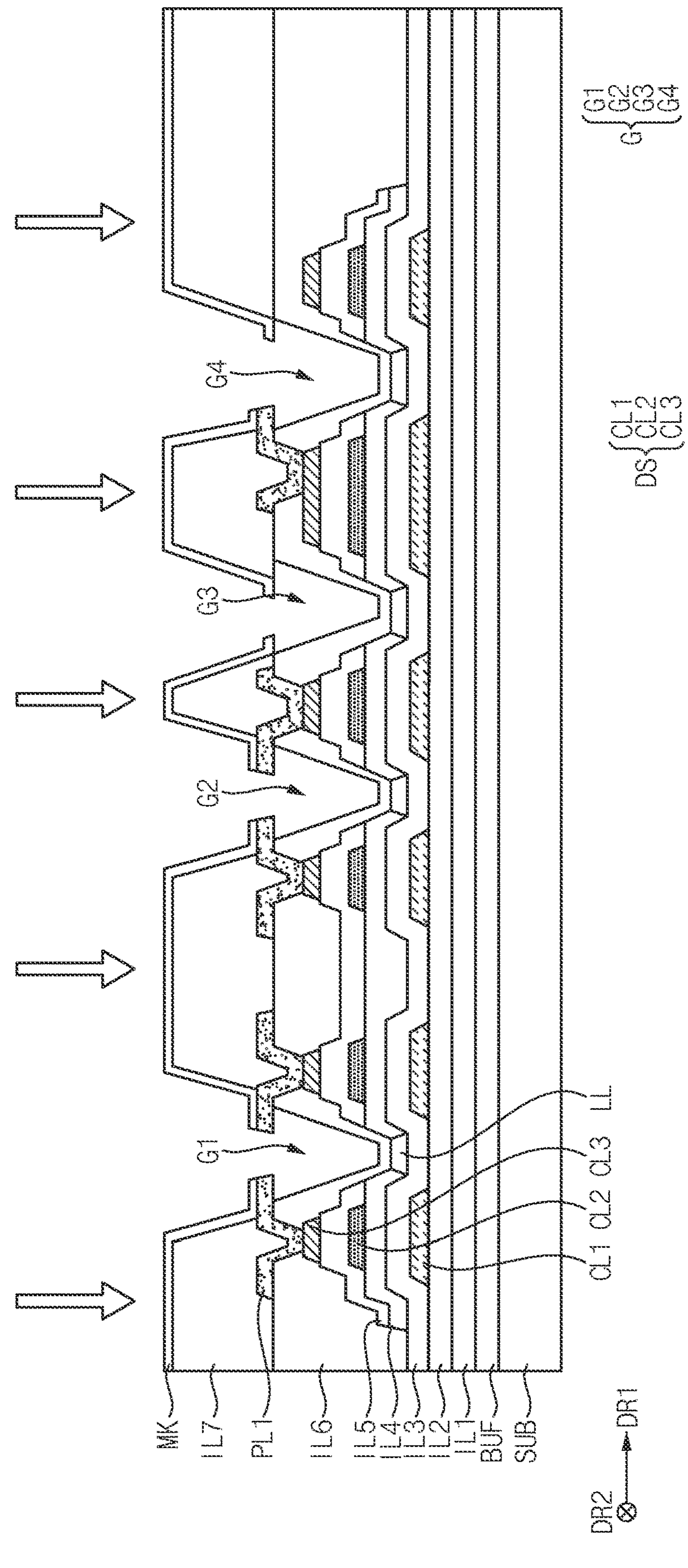

Referring to FIGS. 12 and 13, mask patterns MK may be formed on the seventh insulating layer IL7 in the functional area. The mask patterns MK may be formed not to contact the sixth insulating layer IL6. The mask patterns MK may protect the seventh insulating layer IL7 from being etched during an etching process of the sixth insulating layer IL6. For example, each of the mask patterns MK may be formed using a conductive metal oxide. In an embodiment, each of the mask patterns MK may be formed using indium gallium zinc oxide (IGZO).

After the mask patterns MK are formed, a first etching process may be performed on the sixth insulating layer IL6 using the mask patterns MK as a mask. A portion of the sixth insulating layer IL6 that does not overlap the mask patterns MK in a plan view may be removed through the first etching process. Accordingly, the first, second, third, and fourth grooves G1, G2, G3, and G4 may be formed.

After the first, second, third, and fourth grooves G1, G2, G3, and G4 are formed, a second etching process may be performed on the mask patterns MK. Some of the mask patterns MK may be removed through the second etching process. For example, other portions of the mask patterns MK may not be removed through the second etching process.

Figure 14:
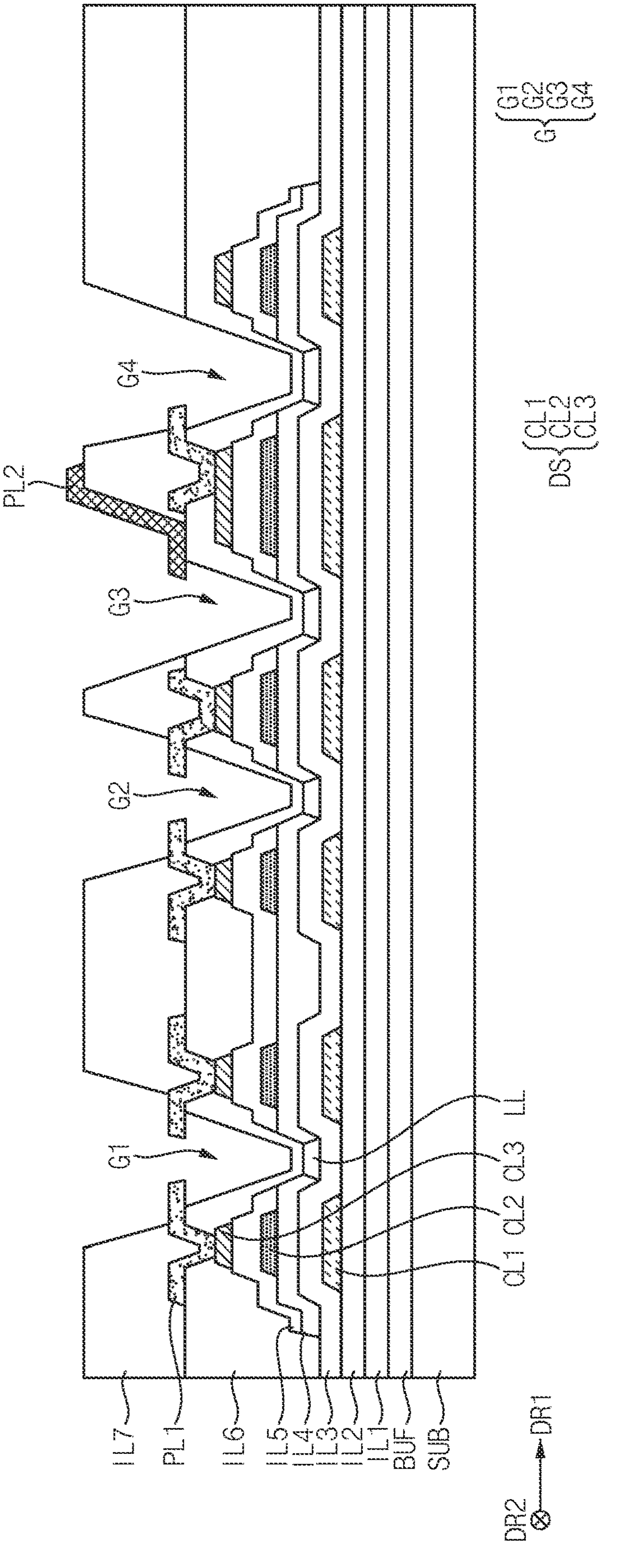

Referring to FIG. 14, a mask pattern not removed through the second etching process may be the second pattern layer PL2. For example, the second pattern layer PL2 and the mask patterns MK may be simultaneously formed through a same process. The second pattern layer PL2 may be formed adjacent to the third groove G3. In another embodiment, the second pattern layer PL2 and the mask patterns MK may be formed in separate processes. In the embodiment, the second pattern layer PL2 may be formed using a transparent material (e.g., a silicon compound), and a material of the second pattern layer PL2 and a material of the mask pattern MK may be different.

Figure 15:
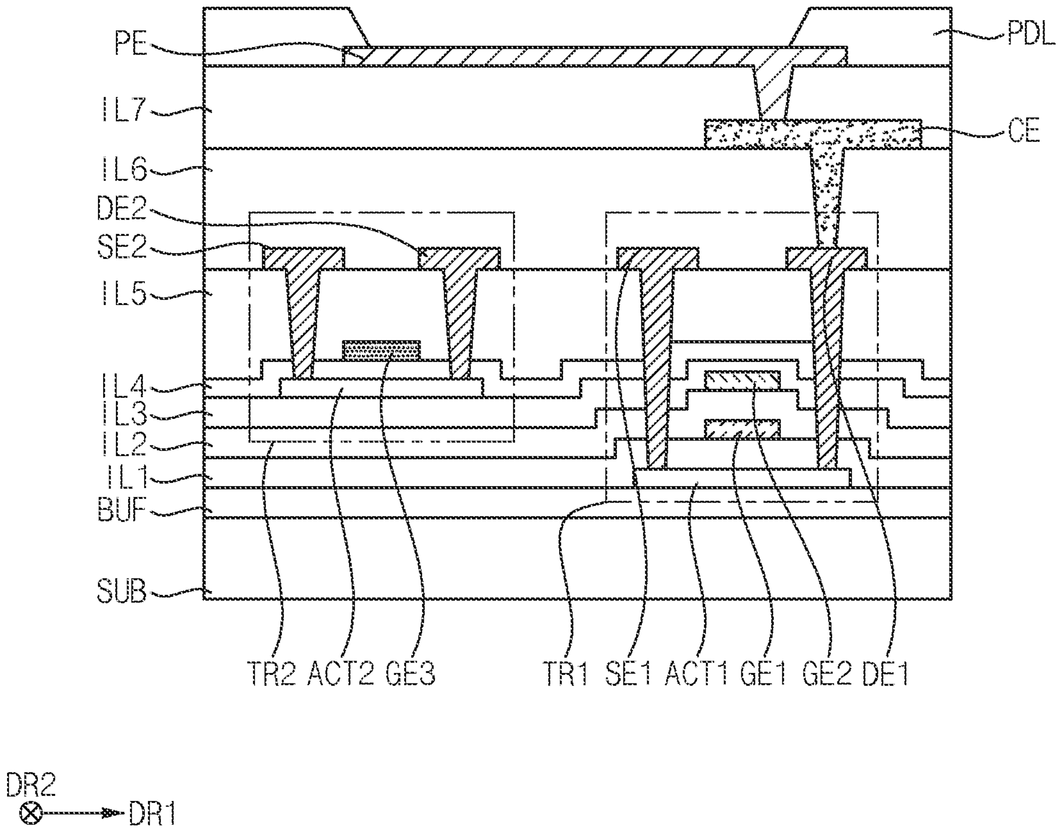
Figure 16:
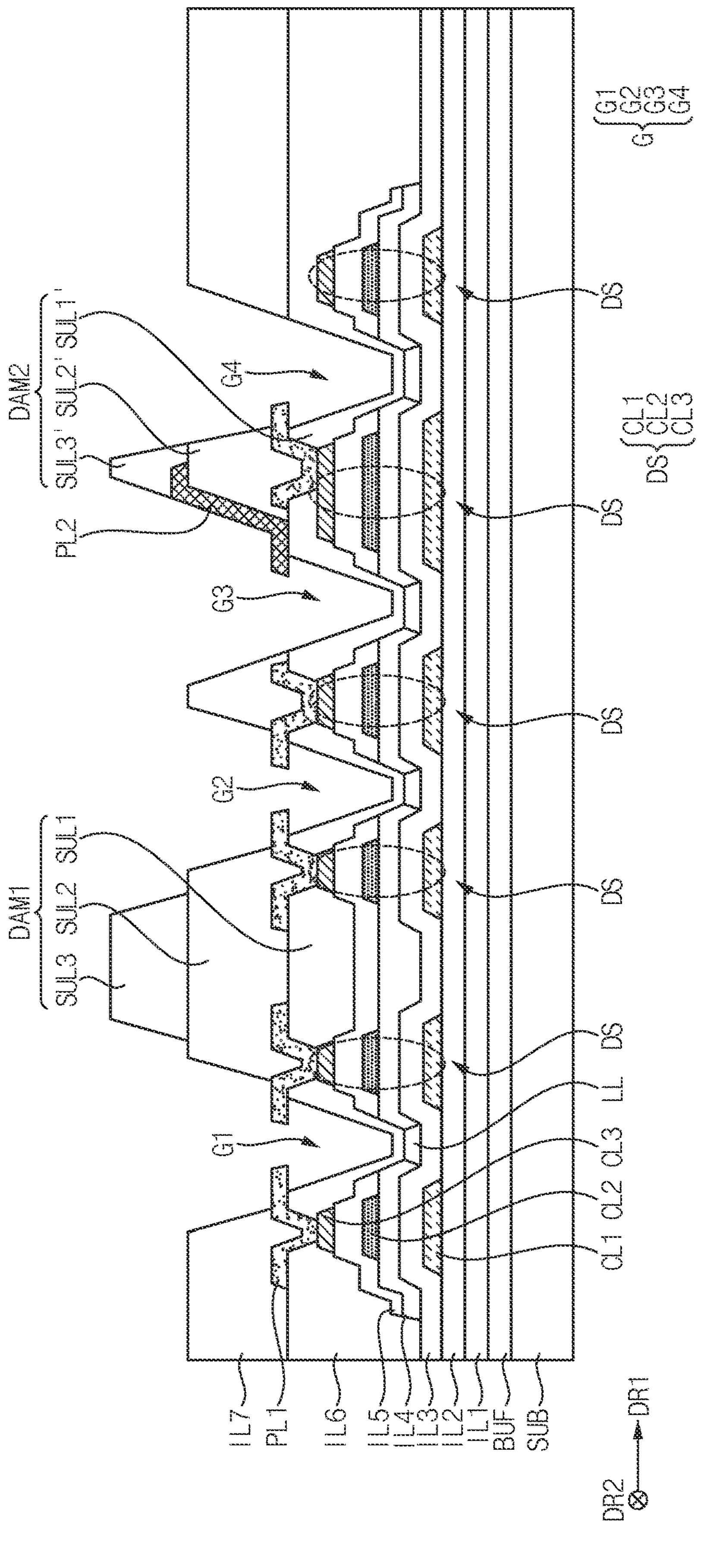

Referring to FIGS. 15 and 16, the pixel electrode PE may be formed in the display area on the seventh insulating layer IL7. The pixel electrode PE may fill a contact hole (see, e.g., the contact hole CNT of FIG. 10) and be connected to the connection electrode CE.

The pixel defining layer PDL may be formed in the display area on the seventh insulating layer IL7. The pixel defining layer PDL may be formed to cover an edge of the pixel electrode PE. For example, the pixel defining layer PDL may be formed using an organic material.

First and second organic layers may be formed in the functional area on the seventh insulating layer IL7. The first organic layer may be formed between the first groove G1 and the second groove G2. The second organic layer may be formed between the third groove G3 and the fourth groove G4. The first and second organic layers and the pixel defining layer PDL may be simultaneously formed through a same process.

The first organic layer may constitute the first dam DAM1 together with the sixth and seventh insulating layers IL6 and IL7 formed under the first organic layer. The second organic layer may constitute the second dam DAM2 together with the sixth and seventh insulating layers IL6 and IL7 formed under the second organic layer. For example, the first dam DAM1 may include sequentially formed the first, second, and third sub-layers SUL1, SUL2, and SUL3, and the second dam DAM2 may include sequentially formed the first, second, and third sub-layers SUL1', SUL2', and SUL3'.

Figure 17:
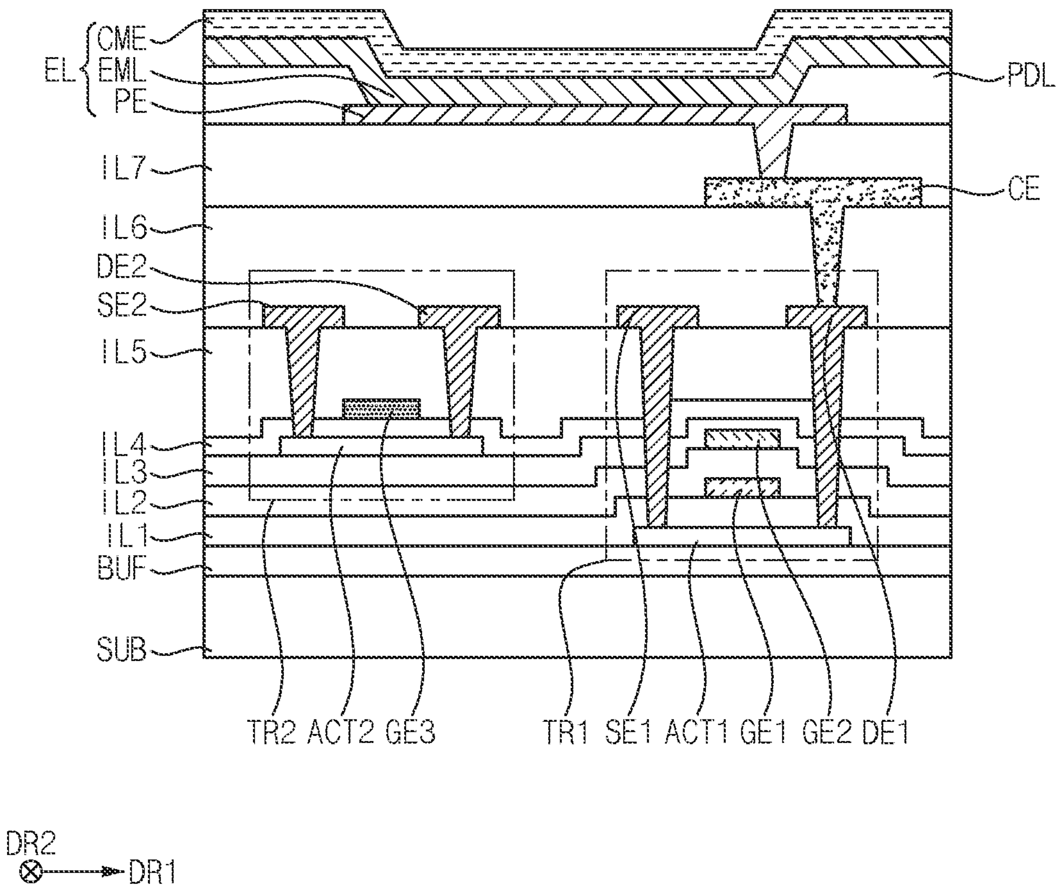
Figure 18:
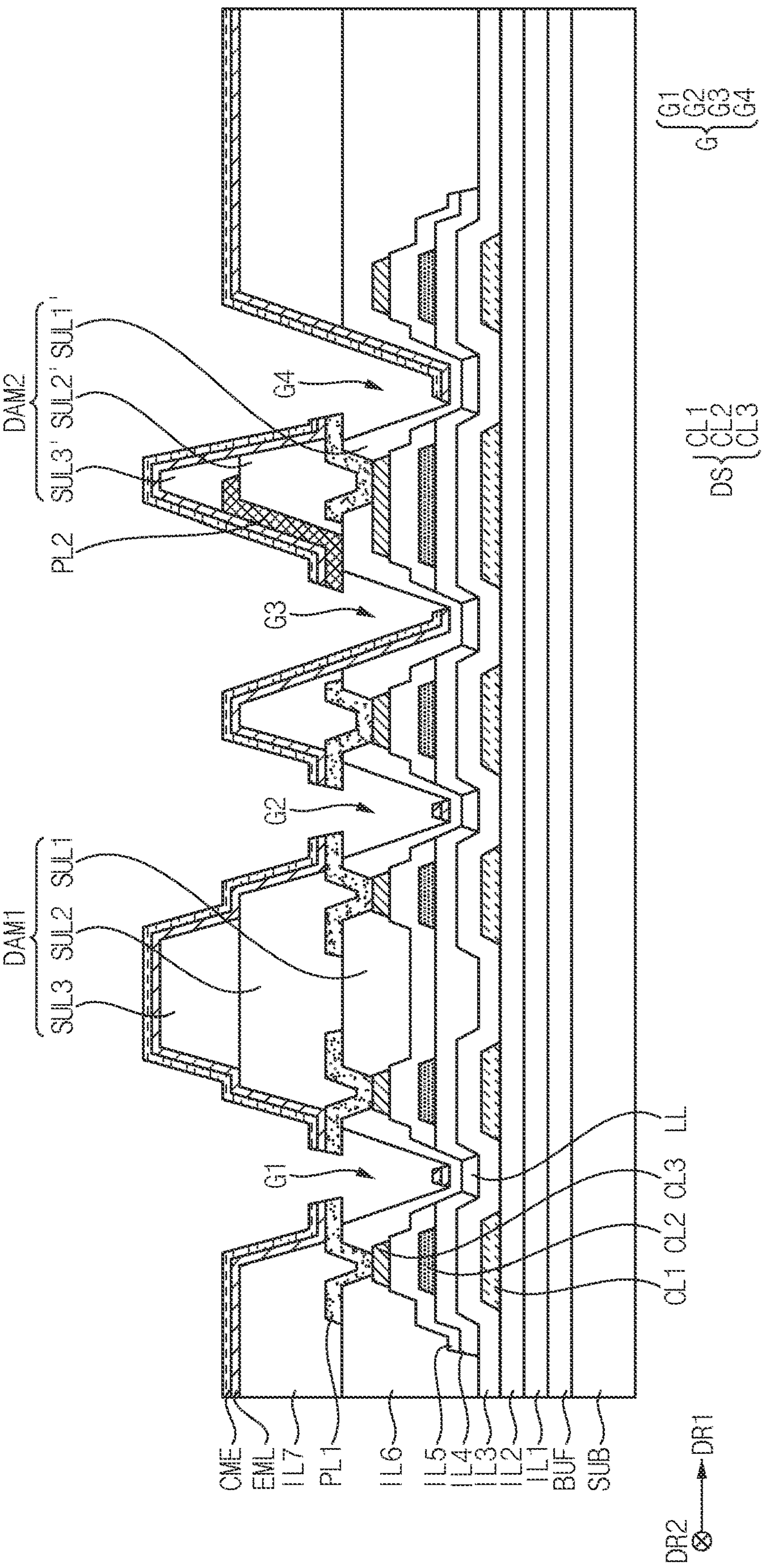

Referring to FIGS. 17 and 18, the organic light emitting layer EML may be formed on the pixel electrode PE and the pixel defining layer PDL. The organic light emitting layer EML may be formed (e.g., entirely formed) in the display area and the functional area. In the functional area, the organic light emitting layer EML may be disconnected at a tip protruding toward the groove G of each of the first and second pattern layers PL1 and PL2.

The common electrode CME may be formed on the organic light emitting layer EML. The common electrode CME may be formed (e.g., entirely formed) in the display area and the functional area. In the functional area, the common electrode CME may be disconnected at the tip (see, e.g., each of the tip PT1 and PT2 of FIG. 5) protruding toward the groove G of each of the first and second pattern layers PL1 and PL2.

Figure 19:
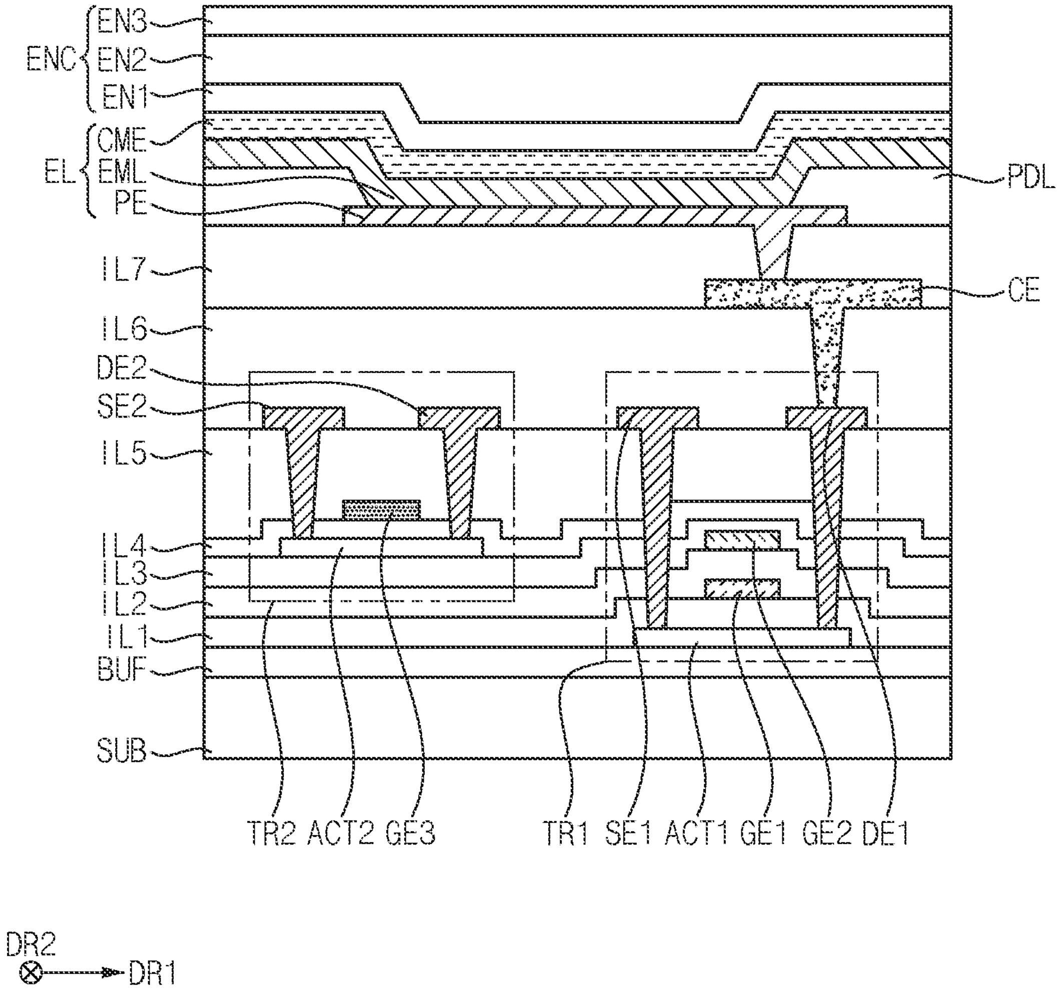
Figure 20:
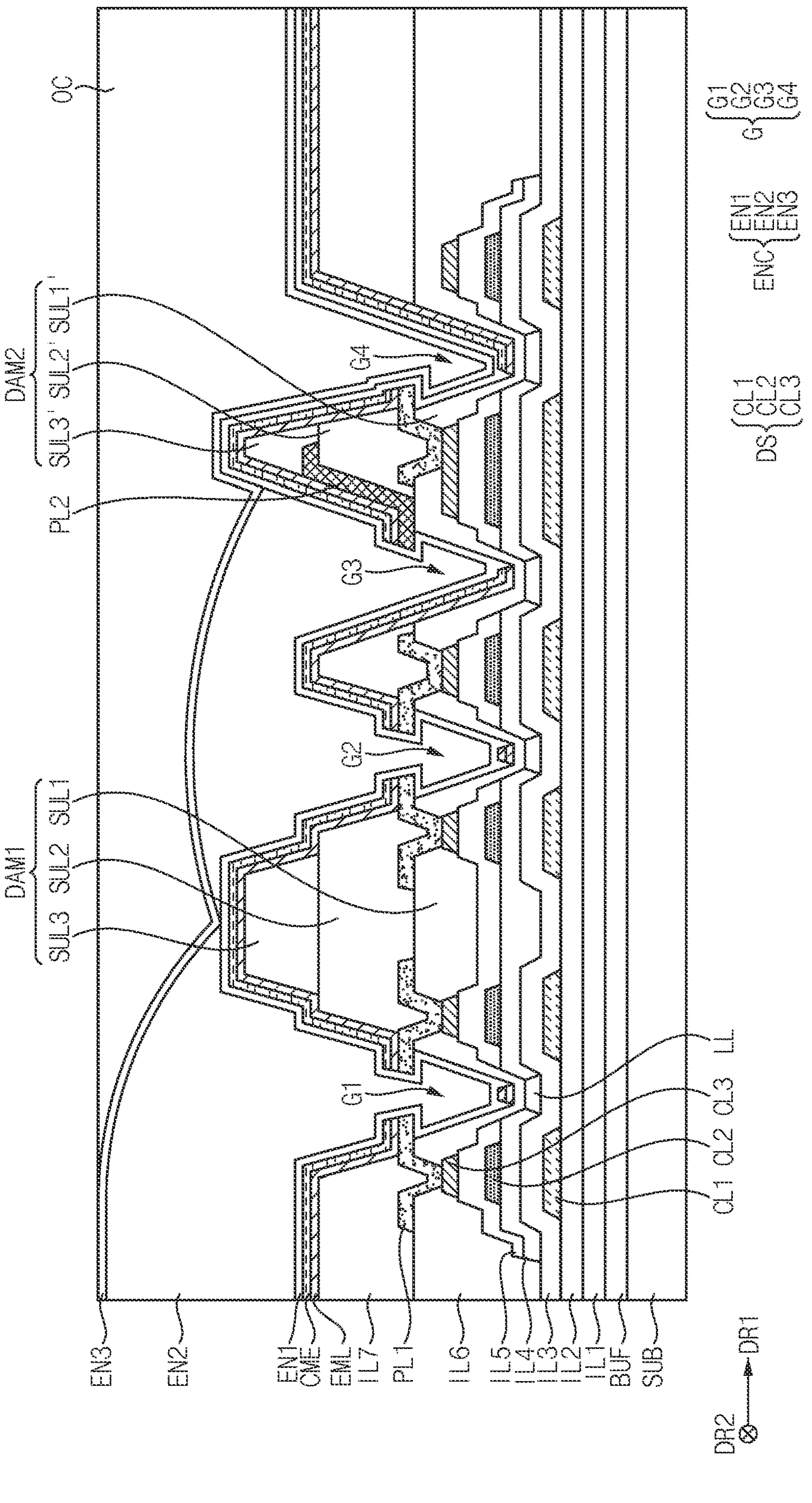

Referring to FIGS. 19 and 20, the first inorganic encapsulation layer EN1 may be formed on the common electrode CME. The first inorganic encapsulation layer EN1 may be formed (e.g., entirely formed) in the display area and the functional area.

The organic encapsulation layer EN2 may be formed on the first inorganic encapsulation layer EN1. The organic encapsulation layer EN2 may be formed (e.g., entirely formed) in the display area and may be formed in a portion of the functional area. In the functional area, the organic encapsulation layer EN2 may be formed to fill the first, second, and third grooves G1, G2, and G3, but may not fill the fourth groove G4.

The second inorganic encapsulation layer EN3 may be formed on the organic encapsulation layer EN2. The second inorganic encapsulation layer EN3 may be formed (e.g., entirely formed) in the display area and the functional area.

The overcoat layer OC may be formed in the functional area on the second inorganic encapsulation layer EN3. The overcoat layer OC may be formed to fill the fourth groove G4. For example, the overcoat layer OC may be formed using an organic material.

Figure 21:
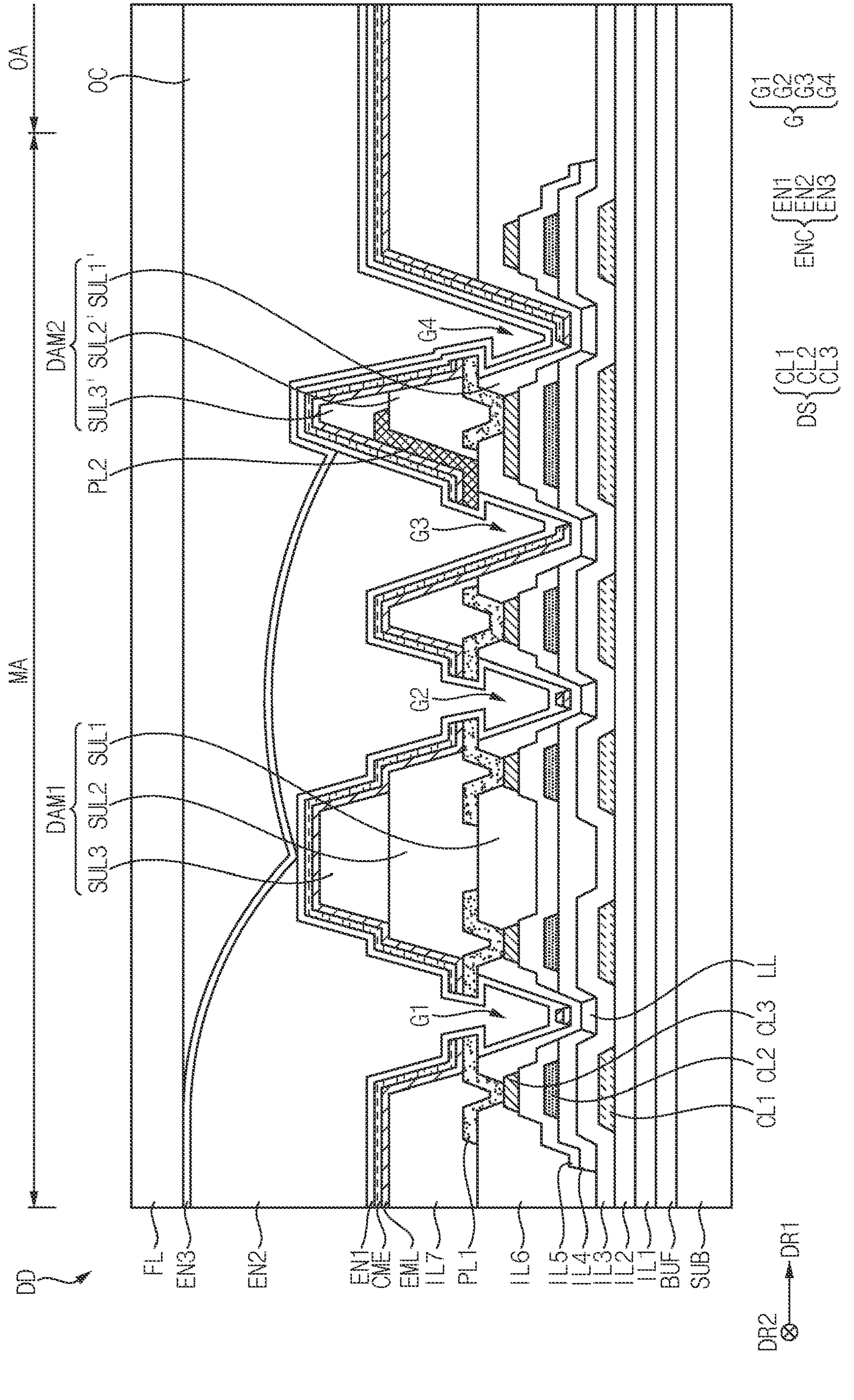

Referring to FIGS. 4 and 21, the functional layer FL may be formed on the encapsulation layer ENC. The functional layer FL may be formed (e.g., entirely formed) in the display area and the functional area.

Referring to FIGS. 5 and 21, the functional area FA may be divided into the middle area MA and the opening area OA. The middle area MA may be an area in which the first, second, third, and fourth grooves G1, G2, G3, and G4, the first dam DAM1, and the second dam DAM2 are formed. The opening area OA may be an area surrounded by the middle area MA. A portion of the display device DD overlapping the opening area OA in a plan view may be removed to form the through hole TH. The functional module FM may be disposed in the through hole TH.

Accordingly, the display device DD illustrated in FIGS. 4 and 5 may be manufactured.

Figure 22:
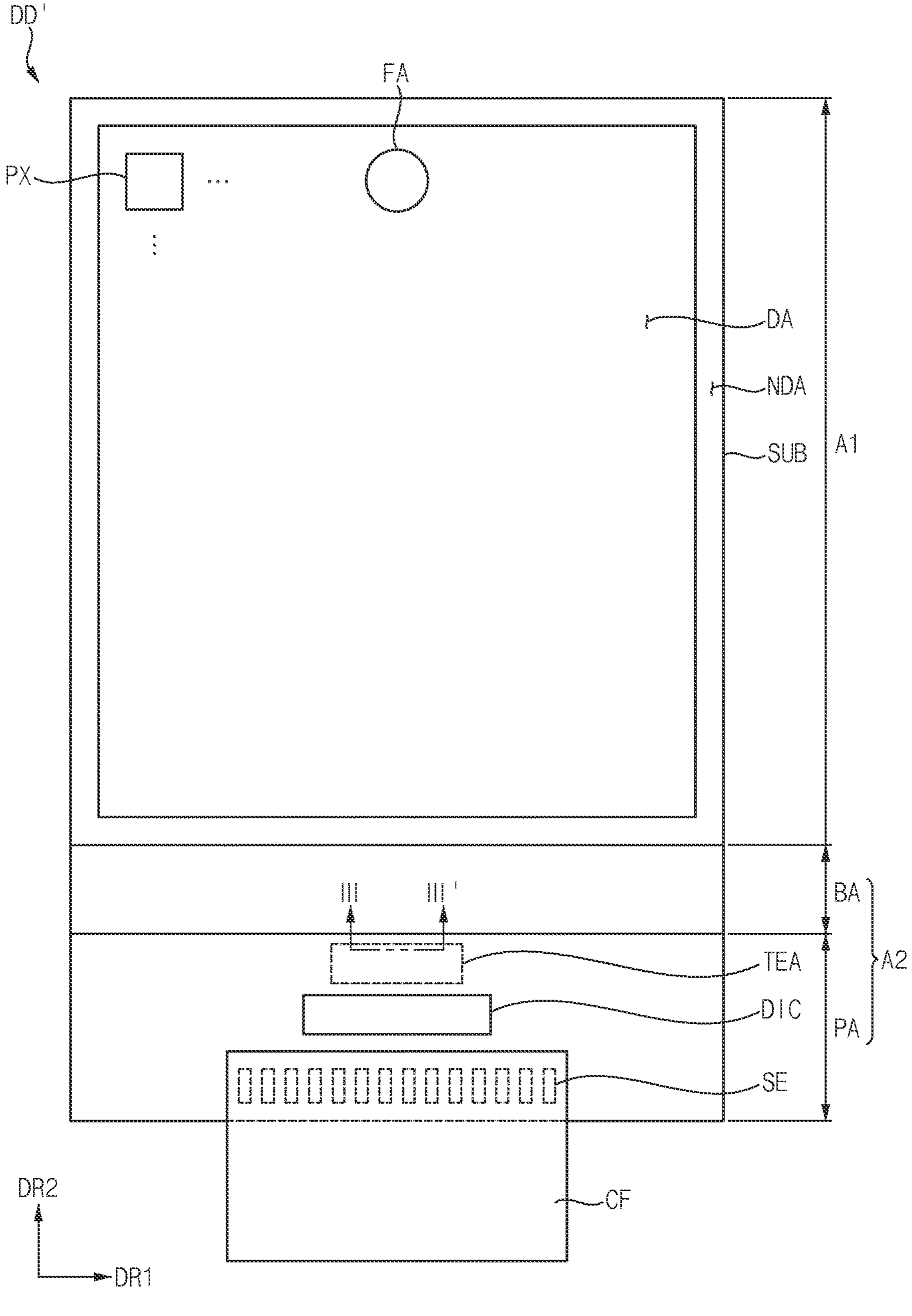
FIG. 22 is a schematic plan view illustrating a display device according to another embodiment of the disclosure.
Figure 23:
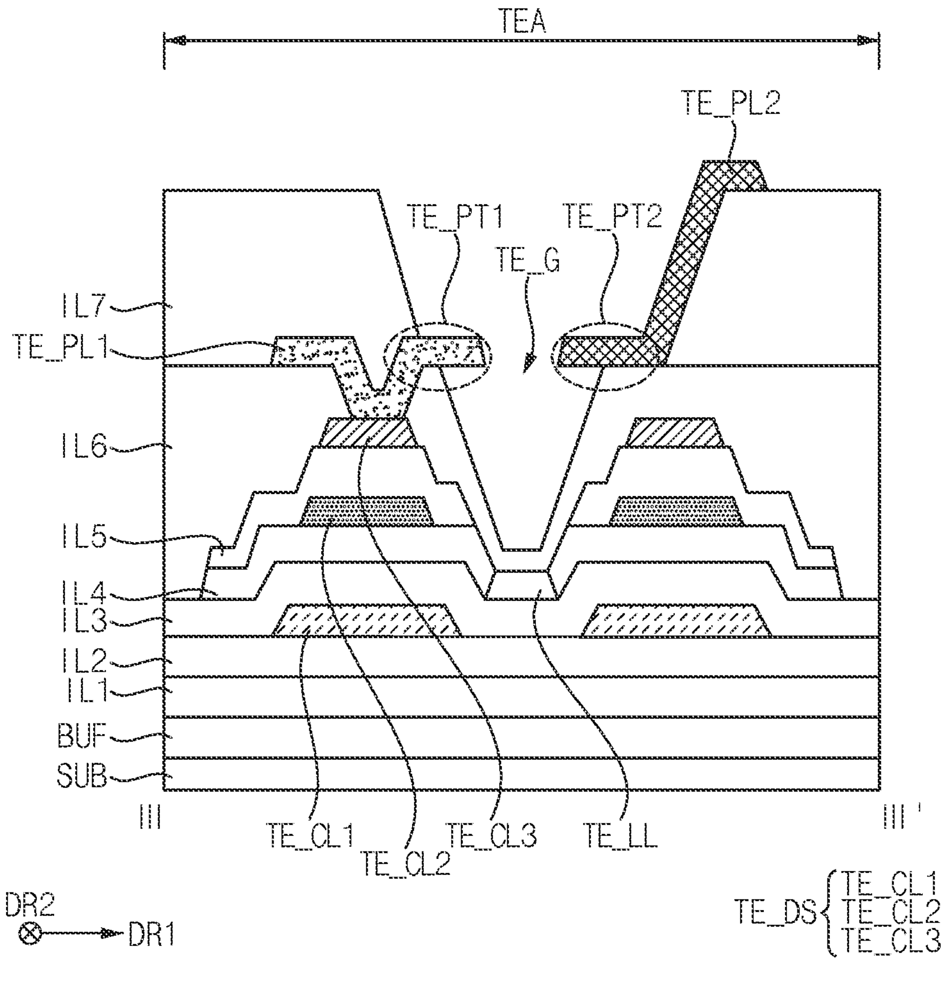
FIG. 23 is a schematic cross-sectional view taken along line III-III' of FIG. 22.

FIG. 22 is a schematic plan view illustrating a display device according to another embodiment of the disclosure. FIG. 23 is a schematic cross-sectional view taken along line III-III' of FIG. 22. For example, FIG. 23 is a schematic cross-sectional view illustrating a portion of a test area TEA of FIG. 22.

Referring to FIGS. 22 and 23, the display device DD' according to another embodiment of the disclosure may include a substrate SUB, a buffer layer BUF, a first, a second, a third, a fourth, a fifth, a sixth, and a seventh insulating layers IL1, IL2, IL3, IL4, IL5, IL6, and IL7, dummy stacks TE_DS, a groove TE_G, a first pattern layer TE_PL1, a second pattern layer TE_PL2, a driving integrated circuit DIC, signal pads SE, and a connection film CF. Each of the dummy stacks TE_DS may include a first, a second, and a third conductive layers TE_CL1, TE_CL2, and TE_CL3 sequentially disposed. Hereinafter, descriptions of the display device DD described with reference to FIGS. 1 to 6 will be omitted or simplified.

The substrate SUB may include a first area A1 and a second area A2. The first area A1 may include a display area DA, a functional area FA, and a portion of the non-display area NDA, and the second area A2 may include another portion of the non-display area NDA. The another portion of the non-display area NDA of the second area A2 may include a bending area BA and a pad area PA.

In an embodiment, the pad area PA may include the test area TEA. The test area TEA may be disposed adjacent to the driving integrated circuit DIC.

The groove TE_G may be disposed in the test area TEA on the substrate SUB. The groove TE_G may penetrate the sixth insulating layer IL6.

The first pattern layer TE_PL1 may be disposed in the test area TEA on the sixth insulating layer IL6. The first pattern layer TE_PL1 may be disposed adjacent to the groove TE_G. For example, the first pattern layer TE_PL1 may be disposed adjacent to a side of the groove TE_G. An end of the first pattern layer TE_PL1 may be a first tip TE_PT1 protruding toward the groove TE_G. The first tip TE_PT1 may be positioned on a side of the groove TE_G. For example, the first pattern layer TE_PL1 may include an opaque material (e.g., a metal). In another embodiment, in the test area TEA, the first pattern layer TE_PL1 may be omitted.

In an embodiment, at least one second pattern layer TE_PL2 may be disposed in the test area TEA on the substrate SUB. The second pattern layer TE_PL2 may be disposed on a portion of the sixth insulating layer IL6 and extend along a side surface of the seventh insulating layer IL7 to a portion of an upper surface of the seventh insulating layer IL7. An end of the second pattern layer TE_PL2 may be a second tip TE_PT2 protruding toward the groove TE_G. The second tip TE_PT2 may be positioned on a side of the groove TE_G. Although FIG. 23 illustrates that there is only one second pattern layer TE_PL2 in the test area TEA, the disclosure is not limited thereto. For example, in the test area TEA, the number of the second pattern layer TE_PL2 may be two or more.

Figure 24:
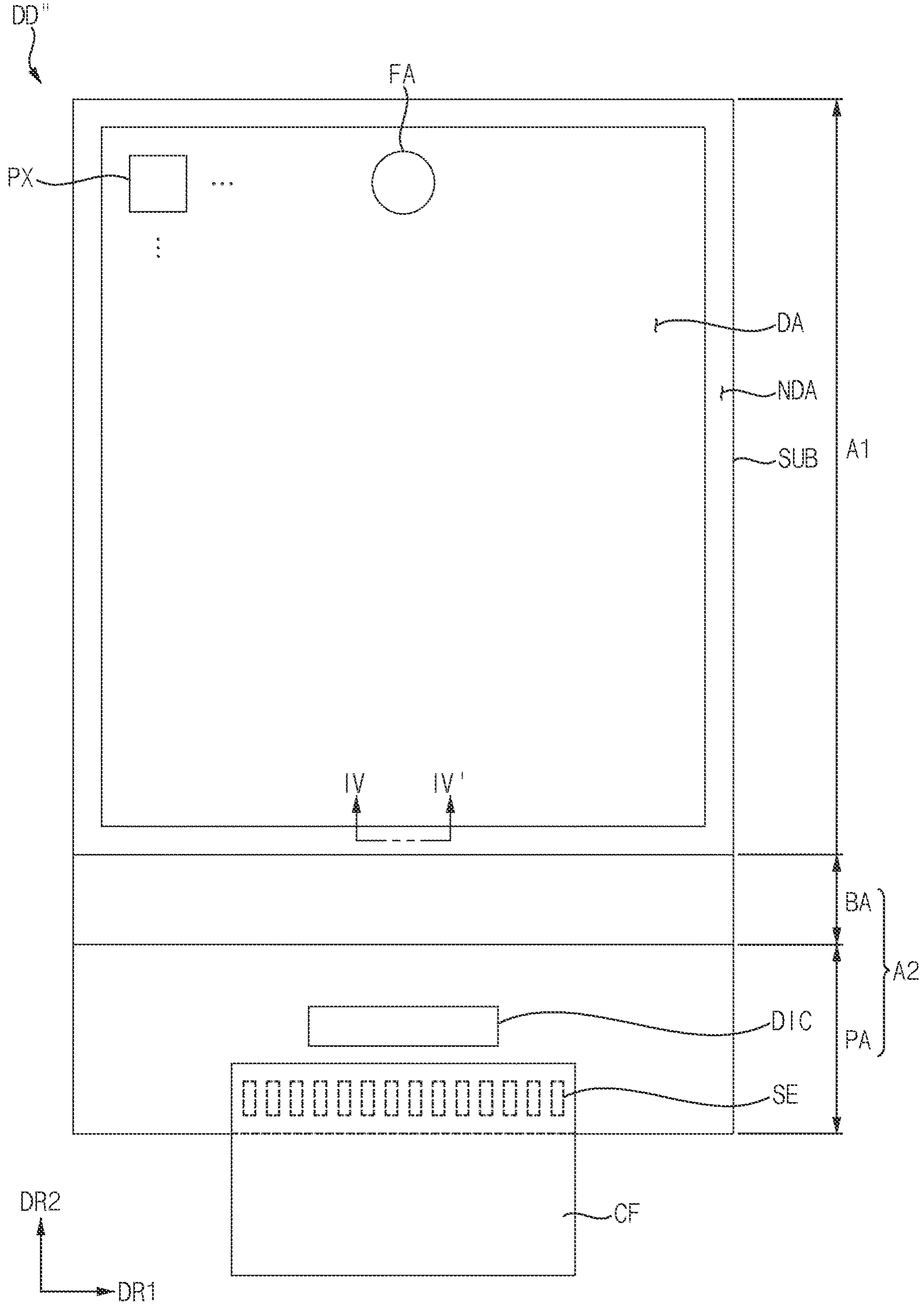
FIG. 24 is a schematic plan view illustrating a display device according to another embodiment of the disclosure.

FIG. 24 is a schematic plan view illustrating a display device according to another embodiment of the disclosure.

Figure 25:
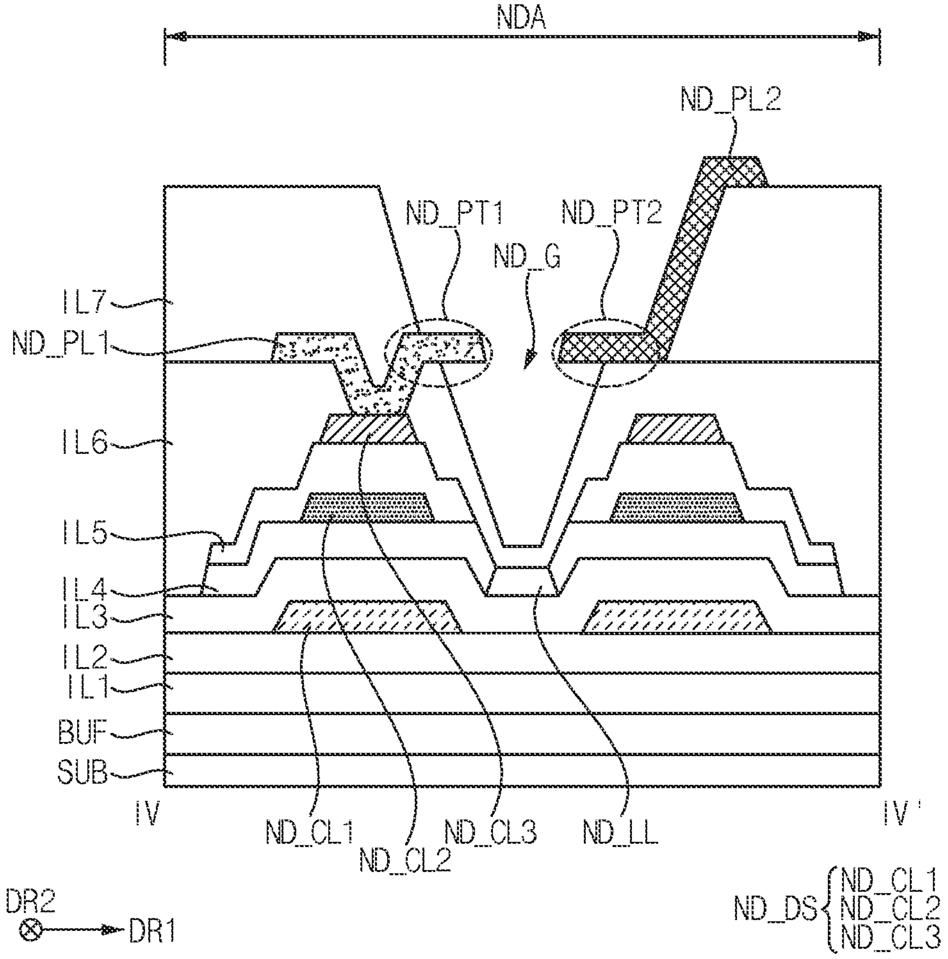
FIG. 25 is a schematic cross-sectional view taken along line IV-IV' of FIG. 24.

FIG. 25 is a schematic cross-sectional view taken along line IV-IV' of FIG. 24. For example, FIG. 25 is a schematic cross-sectional view illustrating a portion of a non-display area NDA of FIG. 24.

Referring to FIGS. 24 and 25, a display device DD" according to another embodiment of the disclosure may include a substrate SUB, a buffer layer BUF, a first, a second, a third, a fourth, a fifth, a sixth, and a seventh insulating layers IL1, IL2, IL3, IL4, IL5, IL6, and IL7, dummy stacks ND_DS, a groove ND_G, a first pattern layer ND_PL1, a second pattern layer ND_PL2, a driving integrated circuit DIC, signal pads SE, and a connection film CF. Each of the dummy stacks ND_DS may include a first, a second, and a third conductive layers ND_CL1, ND_CL2, and ND_CL3 sequentially disposed. Hereinafter, descriptions of the display device DD described with reference to FIGS. 1 to 6 will be omitted or simplified.

The substrate SUB may include a first area A1 and a second area A2. The first area A1 may include a display area DA, a functional area FA, and a portion of the non-display area NDA, and the second area A2 may include another portion of the non-display area NDA. The another portion of the non-display area NDA of the second area A2 may include a bending area BA and a pad area PA.

The groove ND_G may be disposed in the non-display area NDA on the substrate SUB. The groove ND_G may penetrate the sixth insulating layer IL6.

The first pattern layer ND_PL1 may be disposed in the non-display area NDA on the sixth insulating layer IL6. The first pattern layer ND_PL1 may be disposed adjacent to the groove ND_G. For example, the first pattern layer ND_PL1 may be disposed on a side around the groove ND_G. An end of the first pattern layer ND_PL1 may be a first tip ND_PT1 protruding toward the groove ND_G. The first tip ND_PT1 may be positioned on a side of the groove ND_G. For example, the first pattern layer ND_PL1 may include an opaque material (e.g., a metal). In another embodiment, in the non-display area NDA, the first pattern layer ND_PL1 may be omitted.

In an embodiment, at least one second pattern layer ND_PL2 may be disposed in the non-display area NDA of the first area A1 on the substrate SUB. For example, the second pattern layer ND_PL2 may be disposed on a portion of the sixth insulating layer IL6 and extend along a side surface of the seventh insulating layer IL7 to a portion of an upper surface of the seventh insulating layer IL7. An end of the second pattern layer ND_PL2 may be a second tip ND_PT2 protruding toward the groove ND_G. The second tip ND_PT2 may be positioned on a side of the groove ND_G. Although FIG. 25 illustrates that there is only one second pattern layer ND_PL2 in the non-display area NDA, the disclosure is not limited thereto. For example, in the non-display area NDA, the number of the second pattern layer ND_PL2 may be two or more.

As a result, referring again to FIGS. 1 to 6 and 22 to 25, a pattern layer PL2, TE_PL2, or ND_PL2 including a transparent material, an end of the pattern layer PL2, TE_PL2, or ND_PL2 having a tip PT2, TE_PT2, or ND_PT2 protruding toward a groove G, TE_G, or ND_G may be disposed in at least one of a functional area FA, a test area TEA, and a non-display area NDA.

Figure 26:
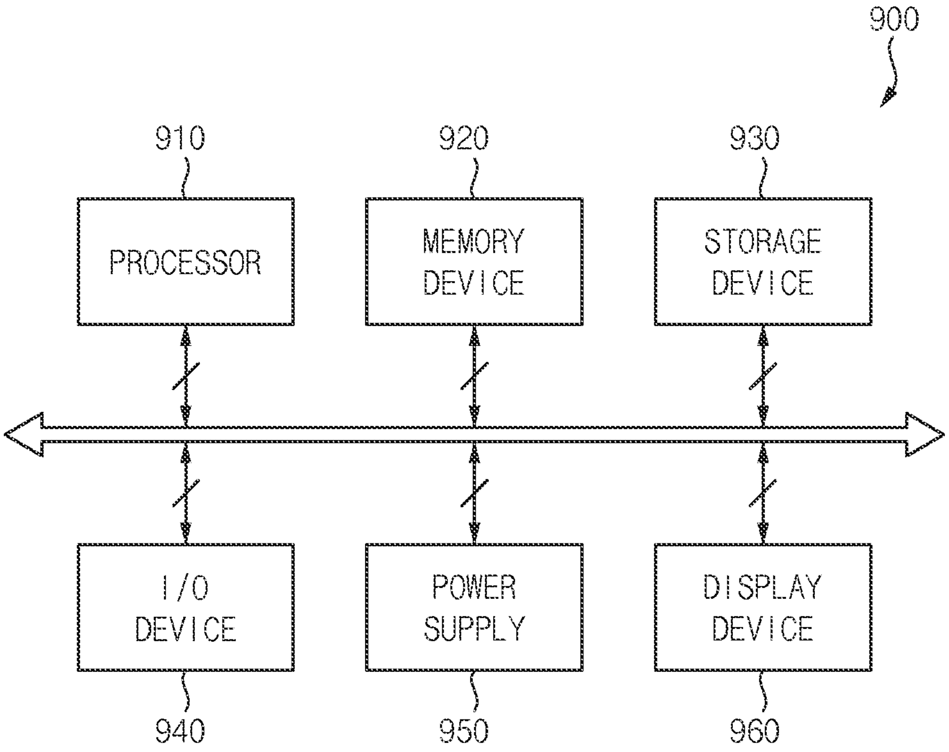
FIG. 26 is a schematic block diagram illustrating an electronic device including the display device of FIG. 1.
Figure 27:
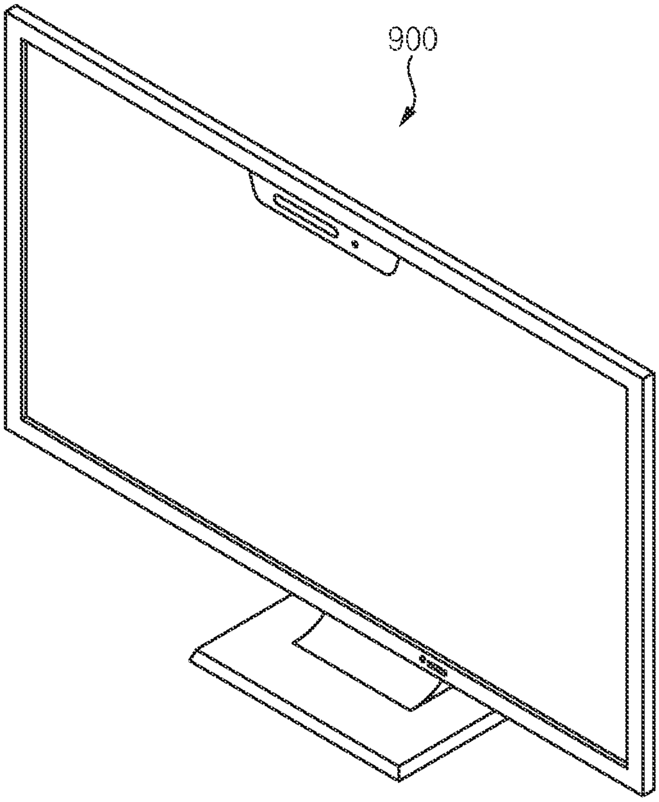
FIG. 27 is a schematic view illustrating an embodiment in which the electronic device of FIG. 26 is implemented as a television.
Figure 28:
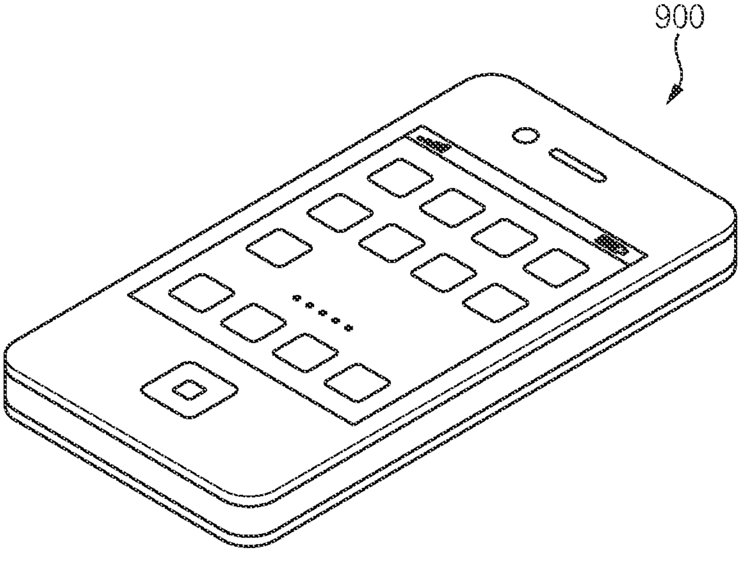
FIG. 28 is a schematic view illustrating an embodiment in which the electronic device of FIG. 26 is implemented as a smart phone.

FIG. 26 is a schematic block diagram illustrating an electronic device including the display device of FIG. 1. FIG. 27 is a schematic view illustrating an embodiment in which the electronic device of FIG. 26 is implemented as a television. FIG. 28 is a schematic view illustrating an embodiment in which the electronic device of FIG. 26 is implemented as a smart phone.

Referring to FIGS. 26, 27 and 28, in an embodiment, the electronic device 900 may include a processor 910, a memory device 920, a storage device 930, an input/output ("I/O") device 940, a power supply 950, and a display device 960. The display device 960 may correspond to the display devices DD, DD', and DD" described with reference to FIGS. 1 to 6 and 22 to 25. The electronic device 900 may further include various ports communicating with a video card, a sound card, a memory card, a USB device, and the like.

In an embodiment, as illustrated in FIG. 27, the electronic device 900 may be implemented as a television. In another embodiment, as illustrated in FIG. 28, the electronic device 900 may be implemented as a smart phone. However, the disclosure is not limited thereto, and in another embodiment, the electronic device 900 may be implemented as a cellular phone, a video phone, a smart pad, a smart watch, a tablet personal computer ("PC"), a car navigation system, a computer monitor, a laptop, a head disposed (e.g., mounted) display ("HMD"), or the like.

The processor 910 may perform various computing functions. In an embodiment, the processor 910 may be a microprocessor, a central processing unit ("CPU"), an application processor ("AP"), or the like. The processor 910 may be electrically connected to other components via an address bus, a control bus, a data bus, or the like. The processor 910 may be electrically connected to an extended bus such as a peripheral component interconnection ("PCI") bus or the like.

The memory device 920 may store data for operations of the electronic device 900. In an embodiment, the memory device 920 may include at least one non-volatile memory device such as an erasable programmable read-only memory ("EPROM") device, an electrically erasable programmable read-only memory ("EEPROM") device, a flash memory device, a phase change random access memory ("PRAM") device, a resistance random access memory ("RRAM") device, a nano floating gate memory ("NFGM") device, a polymer random access memory ("PoRAM") device, a magnetic random access memory ("MRAM") device, a ferroelectric random access memory ("FRAM") device, or the like, and/or at least one volatile memory device such as a dynamic random access memory ("DRAM") device, a static random access memory ("SRAM") device, a mobile DRAM device, or the like.

The storage device 930 may include a solid state drive ("SSD") device, a hard disk drive ("HDD") device, a CD-ROM device, or the like.

The I/O device 940 may include an input device such as a keyboard, a keypad, a mouse device, a touchpad, a touchscreen, or the like, and an output device such as a printer, a speaker, or the like.

The power supply 950 may provide power for operations of the electronic device 900. The display device 960 may be electrically connected to other components via buses or other communication links. In an embodiment, the display device 960 may be included in the I/O device 940.

The disclosure may be applied to various display devices. For example, the disclosure may be applicable to various display devices such as display devices for vehicles, ships, and aircraft, portable communication devices, display devices for exhibition or information transmission, medical display devices, and the like.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:

a display area and a non-display area disposed adjacent to the display area;

a light emitting element disposed in the display area on a substrate;

a plurality of grooves disposed in the non-display area on the substrate and including a first groove and a second groove;

a plurality of first pattern layers disposed adjacent to the first groove and including an opaque material, an end of each of the plurality of first pattern layers being a first tip protruding toward the first groove; and at least one second pattern layer disposed adjacent to the second groove and including a transparent material, an end of the at least one second pattern layer being a second tip protruding toward the second groove;

wherein each of the plurality of first pattern layers is disposed adjacent to at least a side of the first groove, the at least one second pattern layer is disposed adjacent to at least a side of the second groove, the first tip is disposed on the first groove, and the second tip is disposed on the second groove.

2. The display device of claim 1, wherein the non-display area includes a functional area surrounded by the display area and in which a functional module is disposed, and the plurality of grooves, the plurality of first pattern layers, and the at least one second pattern layer are disposed in the functional area.

3. The display device of claim 2, wherein the functional area includes an opening area in which the functional module is disposed and a middle area surrounding the opening area, the display device further comprises:

at least one dam disposed between the plurality of grooves in the middle area.

4. The display device of claim 2, wherein the light emitting element includes:

a pixel electrode;

an organic light emitting layer disposed on the pixel electrode; and a common electrode disposed on the organic light emitting layer, and the organic light emitting layer and the common electrode are disconnected at the first and second tips in the functional area.

5. The display device of claim 2, wherein the functional module includes at least one of a camera module, a face recognition sensor module, a pupil recognition sensor module, an acceleration sensor module, a proximity sensor module, an infrared sensor module, and an illuminance sensor module.

6. The display device of claim 1, wherein each of the first dam and the second dam includes:

a first sub-layer;

a second sub-layer disposed on the first sub-layer; and a third sub-layer disposed on the second sub-layer, each of the first, second, and third sub-layers includes an organic material, and the at least one second pattern layer is disposed on a portion of the first sub-layer of the second dam and extends along a side surface of the second sub-layer of the second dam to a portion of an upper surface of the second sub-layer of the second dam.

7. The display device of claim 1, wherein the opaque material includes a metal.

8. The display device of claim 1, wherein the transparent material includes at least one of a conductive metal oxide and a silicon compound.

9. The display device of claim 8, wherein the conductive metal oxide includes at least one of indium gallium oxide (IGO), indium zinc oxide (IZO), indium tin oxide (ITO), indium zinc tin oxide (IZTO), and indium gallium zinc oxide (IGZO).

10. The display device of claim 8, wherein the silicon compound includes at least one of silicon oxide, silicon nitride, and silicon oxynitride.

11. The display device of claim 1, further comprising:

an active pattern disposed in the display area on the substrate;

a gate electrode disposed on the active pattern;

a source electrode and a drain electrode disposed on the gate electrode; and a connection electrode disposed on the drain electrode and electrically connected to the drain electrode.

12. The display device of claim 11, wherein the plurality of first pattern layers and the connection electrode include a same material.

13. The display device of claim 1, further comprising:

an encapsulation layer including at least one inorganic encapsulation layer and an organic encapsulation layer disposed on the light emitting element.

14. The display device of claim 13, wherein the organic encapsulation layer extends from the display area to a portion of the non-display area, and at least one of the plurality of grooves is filled with the organic encapsulation layer.

* * * * *